US011671121B2

(12) United States Patent
Huang et al.

(10) Patent No.: US 11,671,121 B2
(45) Date of Patent: *Jun. 6, 2023

(54) WIRELESS COMMUNICATION DEVICE AND WIRELESS COMMUNICATION METHOD

(71) Applicant: Panasonic Intellectual Property Management Co., Ltd., Osaka (JP)

(72) Inventors: Lei Huang, Singapore (SG); Michael Hong Cheng Sim, Singapore (SG); Takenori Sakamoto, Kanagawa (JP); Naganori Shirakata, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 36 days.

This patent is subject to a terminal disclaimer.

(21) Appl. No.: 17/239,348

(22) Filed: Apr. 23, 2021

(65) Prior Publication Data

US 2021/0243650 A1 Aug. 5, 2021

Related U.S. Application Data

(63) Continuation of application No. 16/818,691, filed on Mar. 13, 2020, now Pat. No. 11,032,741, which is a (Continued)

(30) Foreign Application Priority Data

Feb. 13, 2015 (JP) ................................. 2015-026836

(51) Int. Cl.
*H03M 13/11* (2006.01)
*H04W 28/06* (2009.01)
(Continued)

(52) U.S. Cl.
CPC ... *H03M 13/6527* (2013.01); *H03M 13/1148* (2013.01); *H04L 1/001* (2013.01);
(Continued)

(58) Field of Classification Search
CPC ............................. H04W 28/065; H04L 1/005
See application file for complete search history.

(56) References Cited

U.S. PATENT DOCUMENTS 7,400,643 B2    7/2008 Hansen et al.
8,271,850 B2    9/2012 Efimov et al.
(Continued)

FOREIGN PATENT DOCUMENTS

CN     1894910 A    1/2007
CN     102396186 A  3/2012
(Continued)

OTHER PUBLICATIONS

Grieve, "Annex L update for the DBand," IEEE 802.11-12/0077r0, IEEE P802.11 Wireless LANs, Jan. 2012, 35 pages.
(Continued)

*Primary Examiner* — Jamal Javaid
*Assistant Examiner* — Ryan C Kavleski
(74) *Attorney, Agent, or Firm* — Seed IP Law Group LLP

(57) ABSTRACT

A wireless communication device serving as an NG60 WiGig device includes a PPDU generator that generates an MF control PHY PPDU (physical layer protocol data unit) including a legacy preamble, a legacy header, an NG60 header (a non-legacy header), a data field, and identification information indicating that the non-legacy header is included in the PPDU and a transmitter that transmits the generated MF control PHY PPDU.

18 Claims, 18 Drawing Sheets

Related U.S. Application Data continuation of application No. 15/619,081, filed on Jun. 9, 2017, now Pat. No. 10,631,203, which is a continuation of application No. PCT/JP2016/000031, filed on Jan. 6, 2016.

(51) Int. Cl.

| | | |
|---|---|---|
| *H03M 13/00* | (2006.01) | |
| *H04L 1/00* | (2006.01) | |
| *H04L 1/06* | (2006.01) | |
| *H04L 5/00* | (2006.01) | |
| *H04L 27/26* | (2006.01) | |
| *H04W 84/12* | (2009.01) | |
| *H04L 69/16* | (2022.01) | |
| *H04L 69/323* | (2022.01) | |

(52) U.S. Cl.
CPC ............ *H04L 1/005* (2013.01); *H04L 1/0057* (2013.01); *H04L 1/0058* (2013.01); *H04L 1/0081* (2013.01); *H04L 1/0631* (2013.01); *H04L 5/0091* (2013.01); *H04L 27/2602* (2013.01); *H04L 27/2603* (2021.01); *H04L 69/161* (2013.01); *H04L 69/323* (2013.01); *H04W 28/065* (2013.01); *H04W 84/12* (2013.01); *H03M 13/1102* (2013.01); *H04L 27/2613* (2013.01)

(56) References Cited

U.S. PATENT DOCUMENTS

| | | | |
|---|---|---|---|
| 10,631,203 | B2 | 4/2020 | Huang et al. |
| 2005/0135284 | A1 | 6/2005 | Nanda et al. |
| 2010/0260159 | A1 | 10/2010 | Zhang et al. |
| 2011/0110348 | A1 | 5/2011 | Lee et al. |
| 2011/0249660 | A1 | 10/2011 | Noh et al. |
| 2012/0218982 | A1 | 8/2012 | Lee et al. |
| 2012/0218983 | A1 | 8/2012 | Noh et al. |
| 2012/0230448 | A1 | 9/2012 | Kang et al. |
| 2012/0269183 | A1 | 10/2012 | Sohn et al. |
| 2012/0314673 | A1 | 12/2012 | Noh et al. |
| 2012/0327915 | A1 | 12/2012 | Kang et al. |
| 2013/0034091 | A1 | 2/2013 | Kim et al. |
| 2013/0188630 | A1 | 7/2013 | Song et al. |
| 2013/0329620 | A1 | 12/2013 | Kim et al. |
| 2014/0204891 | A1 | 7/2014 | Park et al. |
| 2014/0204928 | A1 | 7/2014 | Sorin |
| 2014/0286226 | A1 | 9/2014 | Seok et al. |
| 2014/0307602 | A1 | 10/2014 | Seok |
| 2014/0314064 | A1 | 10/2014 | Park et al. |
| 2014/0321349 | A1 | 10/2014 | Seok et al. |
| 2014/0334420 | A1 | 11/2014 | You et al. |
| 2014/0348097 | A1 | 11/2014 | Park et al. |
| 2015/0009978 | A1 | 1/2015 | Choi et al. |
| 2015/0117227 | A1 | 4/2015 | Zhang et al. |
| 2015/0282068 | A1 | 10/2015 | Rajagopal et al. |
| 2016/0050093 | A1 | 2/2016 | Choi et al. |
| 2016/0087825 | A1* | 3/2016 | Tian ................. H04L 5/0048 370/338 |
| 2016/0119452 | A1 | 4/2016 | Lee |
| 2016/0241682 | A1 | 8/2016 | Xu et al. |
| 2017/0126363 | A1 | 5/2017 | Wang et al. |

FOREIGN PATENT DOCUMENTS

| | | |
|---|---|---|
| JP | 2007-509530 A | 4/2007 |
| JP | 2012-523774 A | 10/2012 |
| KR | 10-2013-0125340 A | 11/2013 |
| WO | 2005/039127 A1 | 4/2005 |
| WO | 2009/113005 A2 | 9/2009 |
| WO | 2010/120692 A1 | 10/2010 |
| WO | 2011/115431 A2 | 9/2011 |
| WO | 2013/022253 A2 | 2/2013 |
| WO | 2014/171788 A1 | 10/2014 |
| WO | 2014/183059 A1 | 11/2014 |
| WO | 2015/006640 A1 | 1/2015 |
| WO | 2015/016684 A1 | 2/2015 |

OTHER PUBLICATIONS

Zhang et al., "Preamble structure for 11ax system," IEEE 802.11-15/0101r1, Jan. 2015, 18 pages.

Zhang et al., "Preamble structure for 11ax system," IEEE 802.11-15/xxxxr0, Jan. 2015, 18 pages.

Chinese Search Report, dated May 17, 2018, for the related Chinese Patent Application No. 201680004381.8.

Extended European Search Report, dated Jan. 26, 2018, for the related European Patent Application No. 16748854.3-1220/3258625, 9 pages.

IEEE Std 802.11ad(TM)-2012, "Part 11: Wireless LAN Medium Access Control (MAC) and Physical Layer (PHY) Specifications, Amendments3: Enhancements for Very High Throughput in the 60 GHz Band", Dec. 28, 2012.

International Search Report, of PCT application No. PCT/JP2016/000031, dated Mar. 1, 2016.

Singapore Search Report, dated Apr. 24, 2018, for the related Singapore Patent Application No. 11201706413U.

\* cited by examiner

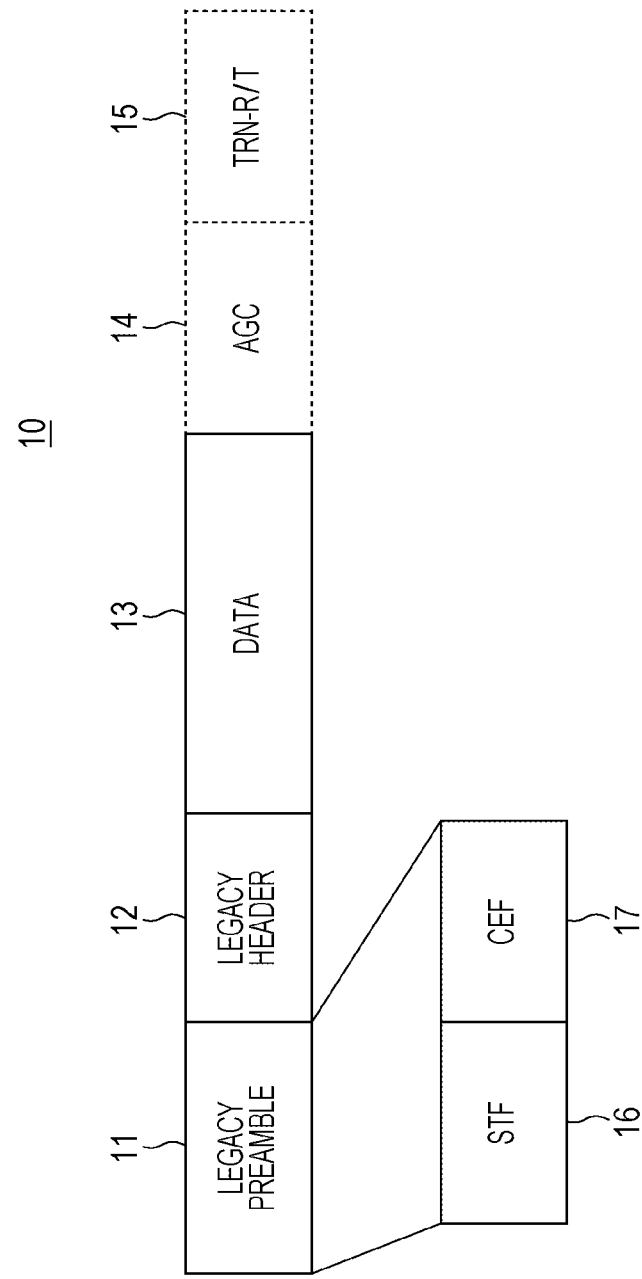

| FIELD NAME | BIT WIDTH | DESCRIPTION |
|---|---|---|
| RESERVED | 1 | SET TO 0 (DIFFERENTIAL DETECTOR INITIALIZATION) |
| SCRAMBLER INITIALIZATION | 4 | BITS X1 TO X4 IN SCRAMBLER INITIALIZATION |
| LENGTH | 10 | THE NUMBER OF DATA OCTETS IN PSDU RANGE: 14 TO 1023 OCTETS |
| PACKET TYPE | 1 | INDICATES WHETHER TRN-TX FIELD OR TRN-T FIELD IS PRESENT |
| TRAINING LENGTH | 5 | LENGTH OF TRAINING FIELD |
| TURNAROUND | 1 | INDICATES IF IT IS NEEDED TO LISTEN FOR INCOMING PPDU IMMEDIATELY AFTER THE DEVICE TRANSMITS PPDU INCLUDING AT LEAST ONE INDIVIDUALLY ADDRESSED MPDU (MAC PROTOCOL DATA UNIT). |
| RESERVED BITS | 2 | |
| HCS | 16 | HEADER CHECK SEQUENCE |

| FIELD NAME | BIT WIDTH | DESCRIPTION |
|---|---|---|
| CBW | 3 | SPECIFIES CHANNEL BANDWIDTH<br>000: STANDARD BANDWIDTH<br>001: 2X STANDARD BANDWIDTH<br>010: 3X STANDARD BANDWIDTH<br>011: 4X STANDARD BANDWIDTH<br>100 TO 111: RESERVED |
| LENGTH | 10 | SPECIFIES THE NUMBER OF DATA OCTETS IN PSDU |
| $N_{sts}$ | 3 | SPECIFIES THE NUMBER OF SPATIOTEMPORAL STREAMS<br>000: 1    001: 2<br>010: 4    011: 8<br>100 TO 111: RESERVED |
| RESERVED BITS | 8 | |
| HCS | 16 | HEADER CHECK SEQUENCE |

| FIELD NAME | BIT WIDTH | DESCRIPTION |
|---|---|---|
| FORMAT IDENTIFICATION | 8 | |
| CBW | 3 | SPECIFIES CHANNEL BANDWIDTH<br>000: STANDARD BANDWIDTH<br>001: 2X STANDARD BANDWIDTH<br>010: 3X STANDARD BANDWIDTH<br>011: 4X STANDARD BANDWIDTH<br>100 TO 111: RESERVED |
| LENGTH | 10 | SPECIFIES THE NUMBER OF DATA OCTETS IN PSDU |
| $N_{sts}$ | 3 | SPECIFIES THE NUMBER OF SPATIOTEMPORAL STREAMS<br>000: 1    001: 2<br>010: 4    011: 8<br>100 TO 111: RESERVED |
| RESERVED BITS | 8 | |
| HCS | 16 | HEADER CHECK SEQUENCE |

| FIELD NAME | BIT WIDTH | DESCRIPTION |
|---|---|---|
| FORMAT IDENTIFICATION/CBW | 8 | |
| LENGTH | 10 | SPECIFIES THE NUMBER OF DATA OCTETS IN PSDU |
| $N_{sts}$ | 3 | SPECIFIES THE NUMBER OF SPATIOTEMPORAL STREAMS<br>000: 1   001: 2<br>010: 4   011: 8<br>100 TO 111: RESERVED |
| RESERVED BITS | 11 | |
| HCS | 16 | HEADER CHECK SEQUENCE |

WIRELESS COMMUNICATION DEVICE AND WIRELESS COMMUNICATION METHOD

BACKGROUND

1. Technical Field

The present disclosure relates to a wireless communication device and a wireless communication method for generating and transmitting a physical layer protocol data unit (PPDU).

2. Description of the Related Art

Wireless communication using the 60-GHz millimeter wave band (hereinafter referred to as "millimeter wave band communication") has drawn attention because, for example, it is license-free. WiGig (Wireless Gigabit) is one of the standards for such millimeter wave band communication and is a wireless communication standard ratified by the IEEE (Institute of Electrical and Electronics Engineers) as the IEEE 802.11ad standard (refer to IEEE 802.11ad-2012).

The technology defined by WiGig (hereinafter referred to as "WiGig technology") enables multi-gigabit high-speed digital transmission. In addition, the WiGig technology complements and extends the MAC (Media Access Control) layer of IEEE 802.11. Furthermore, WiGig technology has downward compatibility (also referred to as "backward compatibility") with the IEEE 802.11 WLAN standard.

In addition, WiGig technology supports a centralized network architecture, such as Infrastructure BSS (Basic Service Set) and PBSS (Personal BSS), in the MAC layer. Note that the term "centralized network architecture" refers to a network structure in which a central coordinator, such as an access point (AP) or a personal BSS control point (PCP), transmits a beacon to synchronize all of stations (STAs) in a network. In addition, WiGig technology achieves directional transmission by using BF (beam forming) more widely than other IEEE 802.11 WLAN technologies operating in the 2.4-GHz or 5-GHz frequency band.

As described above, WiGig has drawn attention because it has many advantages, such as high-speed communication, backward compatibility, support for a centralized network architecture and beamforming.

Common use of WiGig technology is to replace wired communication performed by using a cable in a wired digital interface with wireless communication. For example, by employing WiGig technology, a wireless USB (Universal Serial Bus) link for instant synchronization and a wireless HDMI (registered trademark) (High-Definition Multimedia Interface) link for video streaming can be provided between terminals, such as smartphones and tablets.

SUMMARY

However, the most recent wired digital interfaces, such as USB 3.5 or HDMI (registered trademark) 1.3, enable data transmission of up to several tens of Gbps. Therefore, further evolution of WiGig technology is required so as to provide a data transmission rate comparable to the most recent wired digital interface in wireless communication.

One non-limiting and exemplary embodiment provides a wireless communication device and a wireless communication method capable of further increasing the data transmission rate in WiGig technology while maintaining backward compatibility with the IEEE 802.11 WLAN standard.

In one general aspect, the techniques disclosed here feature a wireless communication device including a physical layer protocol data unit (PPDU) generator that generates a PPDU including a legacy preamble, a legacy header, a non-legacy header, a data field, and identification information indicating that the non-legacy header is included in the PPDU and a transmitter that transmits the PPDU.

According to the present disclosure, the wireless communication device can facilitate increasing the data transmission rate while maintaining backward compatibility with the IEEE 802.11 WLAN standard.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 illustrates an example of an LF control PHY PPDU format, which is the underlying technology used by the present disclosure;

FIG. 2 illustrates an example of the structure of a legacy header, which is the underlying technology used by the present disclosure;

FIG. 7 illustrates an example of the structure of an NG60 header according to the first embodiment;

FIG. 15 illustrates an example of the structure of an NG60 header according to the second embodiment;

FIG. 16 illustrates another example of the structure of the NG60 header according to the second embodiment;

DETAILED DESCRIPTION

Figure 3:
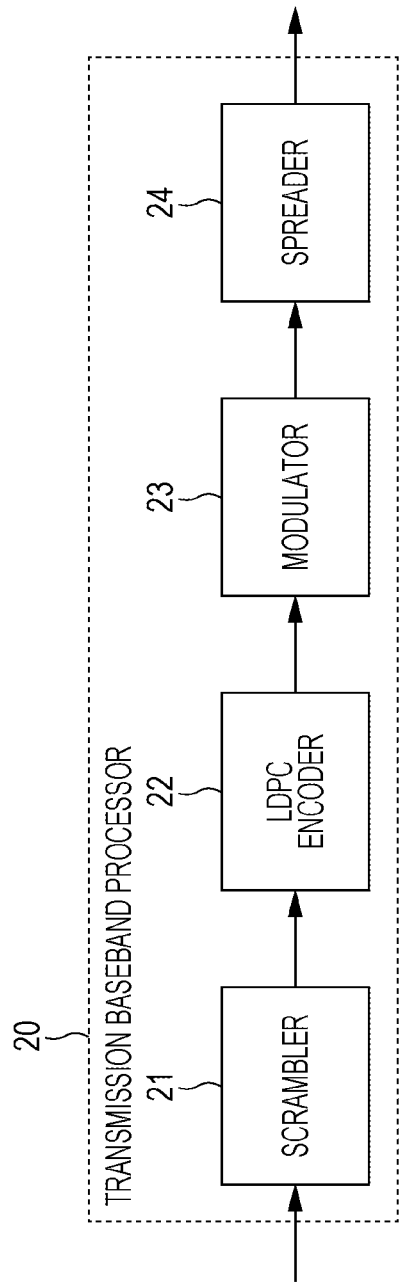
FIG. 3 is a block diagram illustrating an example of the configuration of a transmission baseband processor of a legacy WiGig device, which is the underlying technology used by the present disclosure.

Embodiments of the present disclosure are described in detail below with reference to the accompanying drawings.

The outline of the existing WiGig technology described in IEEE 802.11ad-2012, which is the underlying technology on which the embodiments of the present disclosure are based, is described first. To clarify the difference between the existing WiGig technology and the WiGig technology according to the present disclosure, the word "legacy" is attached to terms related to the existing WiGig technology as needed.

Overview of Legacy WiGig

Legacy WiGig technology can provide a PHY (physical layer) data rate of up to 6.7 Gbps by using a standard bandwidth of 2.16 GHz. In the legacy WiGig, the physical layer supports three modulation schemes: control modulation, single carrier (SC) modulation, and OFDM (Orthogonal Frequency Division Multiplexing) modulation. Physical layers modulated by using these modulation schemes are called "control PHY", "SC PHY", and "OFDM PHY", respectively.

The control PHY is mainly used to transmit a control/extension frame related to beamforming (BF) training. Examples of a control/extension frame include a sector sweep (SSW) frame, an SSW feedback frame, a beam refinement protocol (BRP) frame, and a directional multi-gigabit (DMG) beacon frame.

In addition, the control PHY is used to transmit a control frame related to collision avoidance. Examples of a control frame include an RTS (Request-to-Send) frame, a DMG CTS (Clear-to-Send: transmission allowed) frame, and a DMG DTS (Denial-to-Send: transmission denied) frame.

Unlike the SC PHY and OFDM PHY, control PHY uses a single modulation and coding scheme (MCS) with a very low PHY data rate of about 27.5 Mbps. As a result, the control PHY of the legacy WiGig technology can support wireless transmission much more robustly than SC PHY and OFDM PHY.

Control PHY PPDU Format

The format of the physical layer frame in the legacy WiGig is described below. Note that in the following description, the physical layer frame in the legacy WiGig is referred to as "LF control PHY PPDU". Here, the term "LF" refers to a legacy format, and the term "PPDU" refers to a physical layer protocol data Unit.

FIG. 1 illustrates an example of the format of an LF control PHY PPDU.

As illustrated in FIG. 1, an LF control PHY PPDU 10 includes a legacy preamble 11, a legacy header 12, and a data field 13 in this order. When used for the purpose of beam refinement, the LF control PHY PPDU 10 further optionally includes an AGC (automatic gain control) subfield 14 and a TRN-R/T subfield 15 subsequent to the data field 13.

The legacy preamble 11 has information for identifying the LF control PHY PPDU 10 set forth therein. The legacy preamble 11 includes STF (short training field) 16 and CEF (channel estimation field) 17.

STF 16 is a field used for packet detection, automatic gain control (AGC), frequency offset estimation, synchronization, and frame type indication. STF 16 is built using 50 predefined Golay sequences Ga128 and Gb128. The length of each of the Golay sequences Ga and Gb is 128.

For example, the waveform of the STF 16 is given by the following expression (1):

$$r_{STF}(nT_c) = \begin{cases} Gb_{128}(n \bmod 128)\exp\left(j\pi\frac{n}{2}\right), & n = 0, 1, \ldots, 48 \times 128 - 1 \\ -Gb_{128}(n \bmod 128)\exp\left(j\pi\frac{n}{2}\right), & n = 48 \times 128, \ldots, 49 \times 128 - 1 \\ -Ga_{128}(n \bmod 128)\exp\left(j\pi\frac{n}{2}\right), & n = 49 \times 128, \ldots, 50 \times 128 - 1 \end{cases} \quad (1)$$

In expression (1), Tc is the SC chip time, which is 0.57 nanoseconds. "mod" represents a modulus operation. The Golay sequences Ga128(n) and Gb128(n) are defined in the range of 0≤n≤127. For n outside this range, the Golay sequences Ga128(n) and Gb128(n) are set to 0.

CEF 17 is a field used for channel estimation. CEF 17 is built using nine Golay sequences each having a length of 128.

For example, the waveform of the CEF 17 is given by the following expression (2):

$$r_{CE}(nT_c) = (Gu_{512}(n) + Gv_{512}(n-512) + Gv_{512}(n-1024))\exp\left(j\pi\frac{n}{2}\right), \quad (2)$$

$$n = 0, 1, \ldots, 1151$$

In expression (2), $Gu_{512}$ and $Gv_{512}$ are defined by, for example, the following expressions (3):

$$Gu_{512}=[-Gb_{128}-Ga_{128}Gb_{128}-Ga_{128}]$$

$$Gv_{512}=[-Gb_{128}Ga_{128}-Gb_{128}-Ga_{128}] \quad (3)$$

The legacy header 12 includes a plurality of fields and has various types of pieces of information about the details of the LF control PHY PPDU 10 set forth therein. The structure of the legacy header 12 is described in more detail below.

The data field 13 consists of payload data of a PHY service data unit (hereinafter referred to as "PSDU").

The AGC subfield 14 and the TRN-R/T subfield 15 has information about beam refinement set forth therein.

FIG. 2 illustrates an example of the structure of the legacy header 12.

As illustrated in FIG. 2, the legacy header 12 includes a reserved field, a scrambler initialization field, a length field, a packet type field, a training length field, a turnaround field, a reserved bit field, and a header check sequence (HCS) field. The bit width and description of each of the fields are illustrated in FIG. 2.

For example, the length field of the legacy header 12 specifies the number of data octets in the PSDU. The training length field of the legacy header 12 specifies the length of the AGC subfield 14 and the TRN-R/T subfield 15. The packet type field of the legacy header 12 specifies which one of the TRN-R field and the TRN-T field exists in the TRN-R/T subfield 15.

A wireless communication device supporting the legacy WiGig (hereinafter referred to as "legacy WiGig device") adds a legacy preamble 11 and a legacy header 12 before the payload data of a PSDU to be transmitted and generates the LF control PHY PPDU 10 having the format illustrated in FIG. 1. Thereafter, the legacy WiGig device performs transmission baseband processing, such as scrambling, coding, modulation, and spreading, on the generated LF control PHY PPDU 10. Subsequently, the legacy WiGig device outputs the generated LF control PHY PPDU 10 from a radio antenna.

Configuration of Legacy WiGig Device

FIG. 3 is a block diagram illustrating an example of the configuration of a transmission baseband processor (transmitter) of a legacy WiGig device.

In FIG. 3, a transmission baseband processor 20 of the legacy WiGig device includes a scrambler 21, an LDPC (low density parity check) encoder 22, a modulator 23, and a spreader 24.

The scrambler 21 scrambles the bits of the legacy header 12 and the data field 13 of the LF control PHY PPDU 10 (refer to FIG. 1) in accordance with a predefined scrambling rule.

A shift register of the scrambler 21 is initialized in accordance with the scrambler initialization field (refer to FIG. 2) of the legacy header 12. As a result, the scrambler 21 continues to scramble the bits starting from a bit of the length field of the legacy header 12 (a bit immediately after the scrambler initialization field) to the end of the data field 13 without resetting the shift register.

Thereafter, the scrambler 21 outputs, to the LDPC encoder 22, the LF control PHY PPDU 10 having a portion of the legacy header 12 subsequent to the length field and a portion of the data field 13 that are scrambled.

The LDPC encoder 22 performs LDPC coding (error correction coding) on the bits of the legacy header 12 and the bits of the data field 13 of the LF control PHY PPDU 10 output from the scrambler 21 with an approximate code rate of ½. The LDPC coding is performed in accordance with a predefined coding rule. As a result, the LDPC encoder 22 generates a plurality of LDPC codewords. Thereafter, the LDPC encoder 22 outputs, to the modulator 23, the LF control PHY PPDU 10 having the LDPC-coded portion of the legacy header 12 and the LDPC coded portion of the data field 13.

Note that in the following description, the first LDPC codeword, namely, the LDPC codeword including the bits of the legacy header 12 is referred to as a "header LDPC codeword". In addition, the second LDPC codeword, namely, the LDPC codeword including the bits of the portion of the data field 13 is referred to as a "data LDPC codeword".

Figure 4:
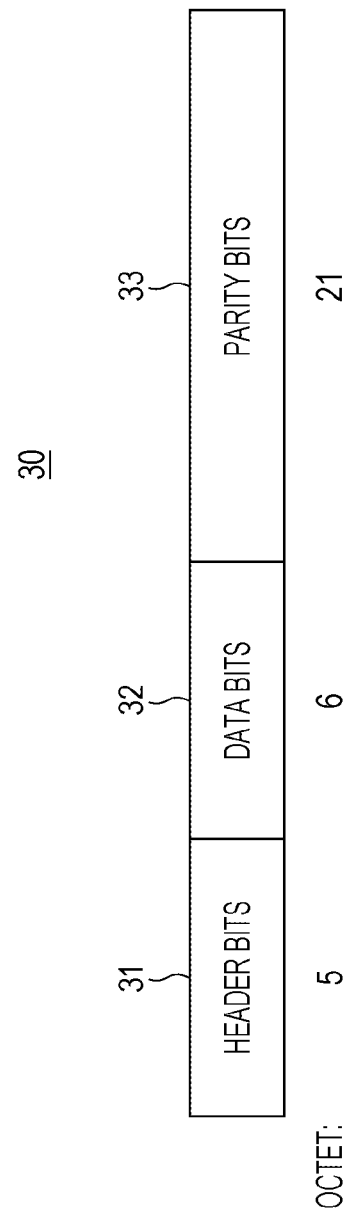
FIG. 4 illustrates an example of the structure of a header LDPC codeword, which is the underlying technology used by the present disclosure.

FIG. 4 illustrates an example of the structure of the header LDPC codeword.

As illustrated in FIG. 4, a header LDPC codeword 30 is formed from header bits 31, data bits 32, and parity bits 33 arranged in this order.

The header bits 31 have a length of 5 octets and represent an LDPC codeword of the legacy header 12. The data bits 32 have a length of 6 octets and represent an LDPC codeword of a first portion of data field 13. The parity bits 33 have a length of 21 octets and represent parity bits appended for error correction coding to be performed on the header bits 31 and the data bits 32.

The modulator 23 modulates the above-described plurality of LDPC codewords (the header LDPC codeword and the data LDPC codeword) included in the LF control PHY PPDU 10 output from the LDPC encoder 22 by using DBPSK (Differential Binary Phase Shift Keying). As a result, the modulator 23 converts each of the plurality of LDPC codewords into a stream of complex constellation points. Thereafter, the modulator 23 outputs, to the spreader 24, the LF control PHY PPDU 10 having the modulated portions of the legacy header 12 and the data field 13.

The spreader 24 spreads each of the constellation points included in the stream included in the LF control PHY PPDU 10 output from the modulator 23 by using a predefined Golay sequence Ga32 having a length of 32. Thereafter, the spreader 24 outputs, to a radio antenna (not illustrated) provided in the legacy WiGig device, the LF control PHY PPDU 10 having the spread portions of the legacy header 12 and the data field 13.

For example, the waveform of the diffused constellation point is given by the following expression (4):

$$r_{HEADER,DATA}(nT_c) = \left(Ga_{32}(n \bmod 32) \cdot d\left(\left\lfloor \frac{n}{32} \right\rfloor\right)\right)\exp\left(j\pi\frac{n}{2}\right), n = 0, 1, \ldots \quad (4)$$

In expression (4), d(k) is defined by the following expressions (5):

$$d(k)=s(k)\times d(k-1)$$

$$s(k)=2c_k-1 \quad (5)$$

Note that s(0) is the first bit of the legacy header 12. d(−1) is set to 1 when used in differential encoding. $\{c_k, k=0, 1, 2, \ldots\}$ are coded bits in a plurality of LDPC codewords.

The radio antenna of the legacy WiGig device (not illustrated in FIG. 3) wirelessly transmits the LF control PHY PPDU 10 output from the spreader 24.

In this manner, the legacy WiGig device on the transmitting side performs transmission baseband processing including scrambling, LDPC coding, modulation, and spreading on the portion from the legacy header 12 to the data field 13 in the LF control PHY PPDU 10 and transmits the LF control PHY PPDU 10.

In addition, if the received signal includes the LF control PHY PPDU 10, the legacy WiGig device on the receiving side detects the legacy preamble 11 from the received signal and extracts the LF control PHY PPDU 10.

Subsequently, the legacy WiGig device on the receiving side performs a calculation process that is the reverse of the calculation process performed by the legacy WiGig device on the transmitting side on the portion from the middle of the legacy header 12 to the data field 13 of the extracted LF control PHY PPDU 10. That is, the legacy WiGig device on the receiving side performs reception baseband processing including despreading, demodulation, LDPC decoding, and descrambling on the portion. In this manner, the legacy WiGig device restores the LF control PHY PPDU 10 to obtain the original LF control PHY PPDU 10.

Subsequently, the legacy WiGig device on the receiving side extracts the bits of the data field 13 from the restored LF control PHY PPDU 10.

As described above, in the legacy WiGig technology, the control PHY PPDU to be transmitted and received in the physical layer is transmitted with the portion from the legacy header 12 to the data field 13 encoded. Thereafter, by detecting the legacy preamble 11 and decoding the legacy header 12, the data field 13 can be decoded and extracted.

Outline of Present Disclosure

The next-generation WiGig according to the present disclosure is described below. The next-generation WiGig according to the present disclosure is a technology that increases the data transmission rate, compared with the legacy WiGig, while maintaining the backward compatibility with the IEEE 802.11 WLAN standard. To clarify the difference from the existing WiGig technology, the term "NG60" (next-generation 60 GHz) is attached to terms related to the WiGig technology according to the present disclosure as needed.

The NG60 WiGig technology according to the present disclosure provides an increase in data transmission rate by supporting transmission that makes use of variable bandwidth.

In addition, backward compatibility with legacy WiGig (including backward compatibility with the IEEE 802.11 WLAN standard) is provided by using a format having the legacy preamble 11 and legacy header 12.

For this reason, the NG60 WiGig defines a mixed format (MF) PPDU in which a legacy format PPDU including the above-mentioned LF control PHY PPDU 10 is combined with a format corresponding to transmission using variable bandwidth. Note that the LF control PHY PPDU is transmitted over the standard bandwidth.

Like the legacy format PPDU, the mixed format PPDU can support three modulation schemes: control modulation, single carrier modulation, and OFDM modulation. That is, the mixed format PPDU can have three types: MF control PHY PPDU, MF SC PHY PPDU, and MF OFDM PHY PPDU.

According to the present disclosure, the format of the MF control PHY PPDU among the mixed format PPDUs of the NG60 WiGig and transmission and reception processing of the format are described. The MF control PHY PPDU of NG60 WiGig corresponds to the LF control PHY PPDU 10 (refer to FIG. 1) of the legacy WiGig.

Figure 6:
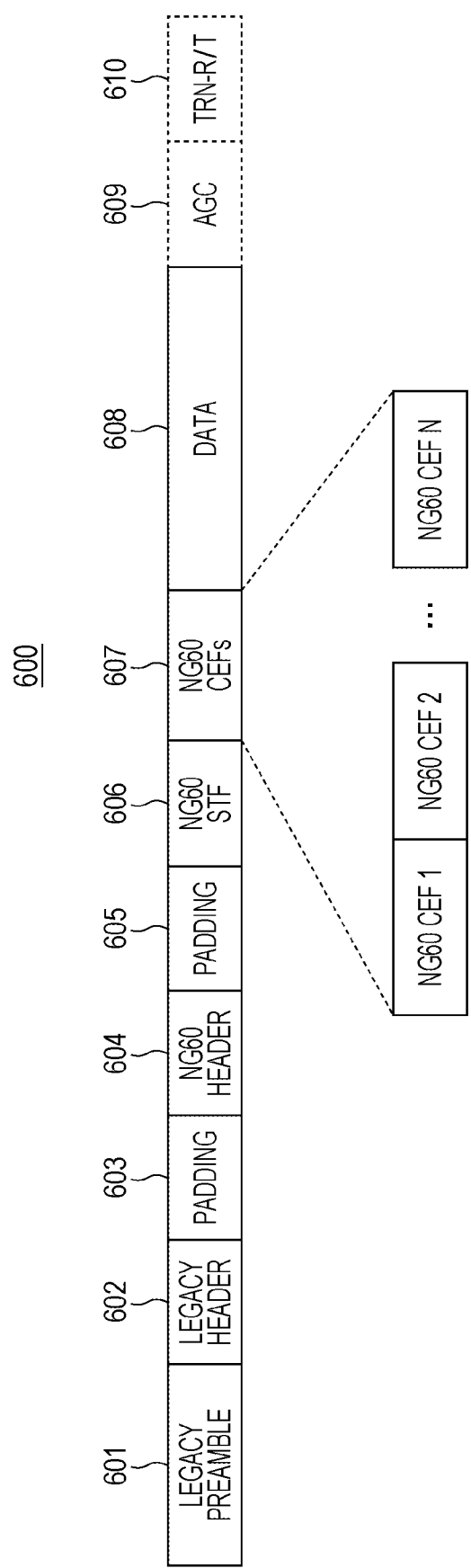
FIG. 6 illustrates an example of the format of an MF control PHY PPDU according to the first embodiment.
Figure 14:
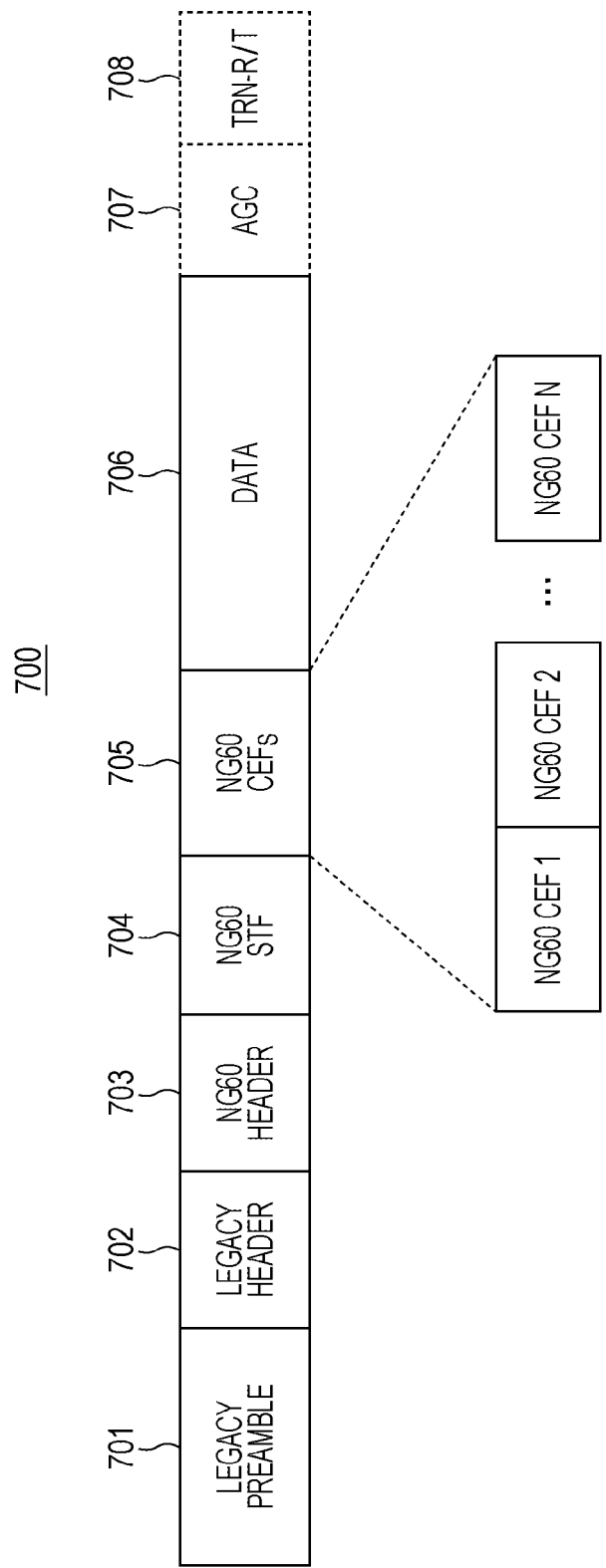
FIG. 14 illustrates an example of the format of an MF control PHY PPDU according to the second embodiment.

In the MF control PHY PPDU, an NG60 header (a non-legacy header) having information about transmission that makes use of variable bandwidth set forth therein and a data field are disposed in this order after the legacy preamble 11 and the legacy header 12 illustrated in FIG. 1 (refer to FIGS. 6 and 14). That is, the NG60 header and the data field are disposed in a portion corresponding to the data field 13 of the LF control PHY PPDU 10. That is, the MF control PHY PPDU includes the NG60 header without changing the structure of the LF control PHY PPDU 10 of the legacy WiGig in which the legacy preamble 11 and the legacy header 12 are disposed at the top.

In this manner, NG60 WiGig can maintain backward compatibility with legacy WiGig. That is, a legacy WiGig device can decode the legacy portion (i.e., the legacy preamble 11 and the legacy header 12) even when the legacy WiGig device receives an MF control PHY PPDU.

In addition, if the received control PHY PPDU includes the NG60 header, the NG60 WiGig device needs to detect and extract the NG60 header. That is, the NG60 WiGig device needs to distinguish the MF control PHY PPDU from the LF control PHY PPDU 10.

Therefore, in the NG60 WiGig, the MF control PHY PPDU includes identification information indicating that the NG60 header is included in the physical layer.

Such identification information can be provided by, for example, rotating the phase of the DBPSK modulation at the start position of the NG60 header or by setting predetermined format identification information at a predetermined position of the PPDU.

The details of the NG60 WiGig device are described below for each of the case where the identification information is provided in the NG60 header by rotating the phase of the DBPSK modulation and the case where the identification information is provided in the NG60 header by using the format identification information set forth in the control PHY PPDU.

First Embodiment

As a first embodiment of the present disclosure, an NG60 WiGig device used in the case where the identification information is provided in the NG60 header by rotating the phase of the DBPSK modulation is described first.
Configuration of Device FIG. 5 is a block diagram illustrating an example of the configuration of the wireless communication device (the NG60 WiGig device) according to the present embodiment.

The wireless communication device according to the present embodiment includes, for example, a CPU (Central Processing Unit), a storage medium, such as a ROM (Read Only Memory), that stores a control program, a work memory, such as a RAM (Random Access Memory), and a communication circuit (none are illustrated). In this case, the function of each of the units of the wireless communication device is provided by, for example, the CPU executing the control program.

Figure 5:
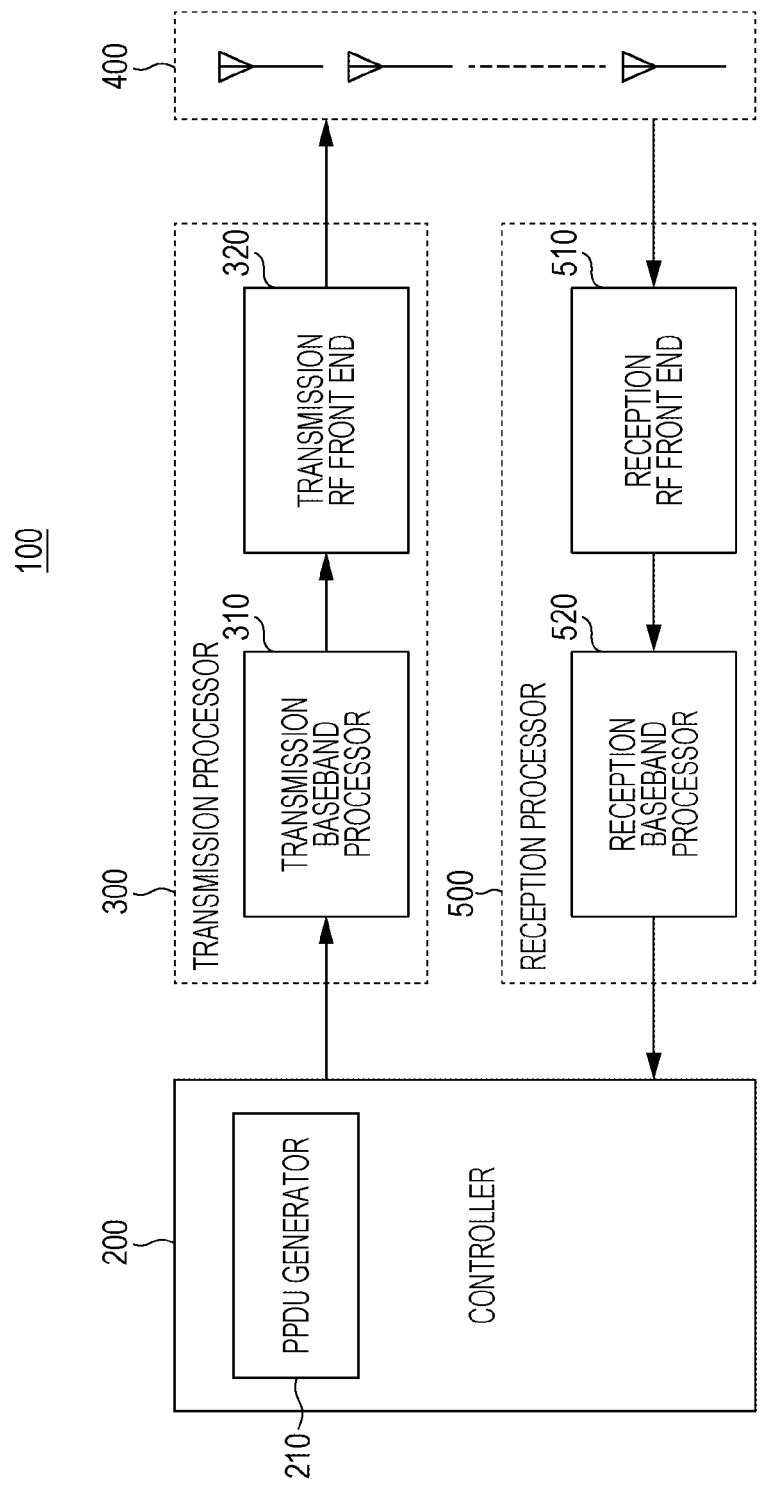
FIG. 5 is a block diagram illustrating an example of the configuration of a wireless communication device (an NG60 WiGig device) according to a first embodiment.

In FIG. 5, a wireless communication device 100, which is an NG60 WiGig device according to the present embodiment, includes a controller 200, a transmission processor 300, an antenna unit 400 having a plurality of radio antennas, and a reception processor 500.

The controller 200 performs various types of data processing of the upper layer, exchanges data between the physical layer and the upper layer, and wirelessly transmits and receives data by using the transmission processor 300, the antenna unit 400, and the reception processor 500. The controller 100 includes a PPDU generator 210.

The PPDU generator 210 generates an MF control PHY PPDU from the payload data of the PSDU and transmits the generated MF control PHY PPDU by using the transmission processor 300 and the antenna unit 400.
PPDU Format The format of the control PHY PPDU in the NG60 WiGig, that is, the format of the MF control PHY PPDU generated by the PPDU generator 210 is described below.

FIG. 6 illustrates an example of the format of an MF control PHY PPDU. FIG. 6 corresponds to FIG. 1.

As illustrated in FIG. 6, an MF control PHY PPDU 600 has a legacy preamble 601, a legacy header 602, a first padding field 603, an NG60 header 604, and a second padding field 605 arranged in this order. In addition, the MF control PHY PPDU 600 has an NG60 STF 606, a plurality of NG60 CEFs 607, and a data field 608 arranged in this order subsequent to the second padding field 605.

Note that, when used for beam refinement, the MF control PHY PPDU 600 may further has an AGC subfield 609 and a TRN-R/T subfield 610 subsequent to the data field 608. That is, the AGC subfield 609 and the TRN-R/T subfield 610 are optional.

The legacy preamble 601 has a waveform the same as the waveform of the legacy preamble 11 of the LF control PHY PPDU 10.

The legacy header 602 has the same configuration as the legacy header 12 of the LF control PHY PPDU 10 (refer to FIG. 2).

The first padding field 603 and the second padding field 605 are areas that are inserted to, for example, adjust the data length.

The NG60 header 604 provides information about the details of the MF control PHY PPDU 600 by itself or together with the legacy header 602. The details of the structure of the NG60 header 604 are described below.

The NG60 STF 606 is an area used for retraining of automatic gain control (AGC).

Since the NG60 STF 606 is used for such retraining and its function is simpler, the NG60 STF 606 can be made shorter than the STF 16 of LF control PHY PPDU 10 (refer to FIG. 1).

For example, the NG60 STF 606 can be formed by using 25 Golay sequences $Gb_{128}$ each having a length of 128. For example, the NG60 STF 606 has the waveform given by the following expression (6):

$$r_{NG60\,STF}(nT_c) = Gb_{128}(n \bmod 128)\exp\left(j\pi\frac{n}{2}\right), n = 0, 1, \ldots, 25 \times 128 - 1 \quad (6)$$

A plurality of NG60 CEFs 607 are an area used for channel estimation of a plurality of space-time streams generated for the data field 608 by the transmission processor 300 in the subsequent stage. Each of the plurality of NG60 CEFs 607 can be formed in the same manner as the legacy CEF 17 (refer to FIG. 1) of the LF control PHY PPDU 10. That is, the NG60 CEFs 607 can have a waveform given by the above-mentioned expressions (2) and (3).

The number of NG60 CEFs 607 in one MF control PHY PPDU 600 is determined by the number of space-time streams generated from the data field 608.

For example, the number (N) of the NG60 CEFs 607 (refer to FIG. 6) is greater than or equal to the number of space-time streams generated from the data field 608. For example, when the number of space-time streams is 2, the number of the NG60 CEFs 607 (refer to FIG. 6) can be set to 2. Alternatively, when the number of space-time streams is 3, the number of the NG60 CEFs 607 (refer to FIG. 6) can be set to 4.

The data field 608 stores the payload data of the PSDU. The data field 608 is a data portion to be transmitted by using a plurality of space-time streams.

The AGC subfield 609 and the TRN-R/T subfield 610 has information about beam refinement set forth therein.

That is, the PPDU generator 210 acquires the payload data of the PSDU to be transmitted and sets the payload data as the data field 608. Thereafter, the PPDU generator 210 adds a portion from the legacy preamble 601 to the plurality of NG60 CEFs 607 before the data field 608 so as to generate an MF control PHY PPDU 600.

FIG. 7 illustrates an example of the structure of the NG60 header 604. FIG. 7 corresponds to FIG. 2.

As illustrated in FIG. 7, the NG60 header 604 has a CBW (channel bandwidth information) field, a length field, an $N_{sts}$ field, a reserved bit field, and an HCS field. The bit width and description of each of the fields are illustrated in FIG. 7.

For example, the CBW field of the NG60 header 604 specifies the channel bandwidth. The length field of the NG60 header 604 specifies the number of data octets in the PSDU. $N_{sts}$ of the NG60 header 604 specifies the number of space-time streams generated from the data field 608.

Note that the PPDU generator 210 sets a value in the length field of the legacy header 602 while taking into account the entire portion from the first padding field 603 to the data field 608. In this manner, upon receiving the MF control PHY PPDU 600, the legacy WiGig device can correctly determine the number of data octets in the PSDU.

As used herein, the value in the length field of the legacy header 602 is referred to as a legacy length field value $L_{LH}$, and the value of the length field of the NG60 header 604 is referred to as an NG60 length field value $L_{NH}$.

The PPDU generator 210 calculates the sum of the NG60 length field value $L_{NH}$, the lengths of the first padding field 603, the NG60 header 604, and the second padding field 605 (i.e., 17 octets), and the equivalent length of the NG60 STF 606 and the NG60 CEFs 607. Thereafter, the PPDU generator 210 sets the legacy length field value $L_{LH}$ to the calculated sum.

As described below, the transmission baseband processor 310 performs DBPSK modulation and LDPC coding with an approximate code rate of ½. Therefore, the equivalent length of NG60 STF 606 and NG60 CEFs 607 is equal to a value obtained by dividing the actual length of NG60 STF 606 and NG60 CEFs 607 by 64, i.e., 6.25+$N_{sts}$×2.25 octets. Here, as described above, $N_{sts}$ is the number of space-time streams generated from the data field 608.

Therefore, the legacy length field value $L_{LH}$ is given by, for example, the following expression (7):

$$L_{LH}=L_{NH}+23.25+N_{sts}\times2.25 \quad (7)$$

It is obvious that the legacy length field value $L_{LH}$ is greater than the NG60 length field value $L_{NH}$ at all times. In addition, as illustrated in FIG. 2, the legacy length field value $L_{LH}$ is less than or equal to 1023 octets. Accordingly, the following expression (8) is derived from expression (7):

$$N_{sts}\times2.25\leq999.75-L_{NH} \quad (8)$$

That is, the number $N_{sts}$ of space-time streams generated from the data field 608 depends on the NG60 length field value $L_{NH}$. In other words, the space-time coding (STC) scheme used for transmission of the data field 608 depends on the length of the data field 608.

Therefore, the PPDU generator 210 sets the NG60 length field value $L_{NH}$ and the legacy length field value $L_{LH}$ so as to conform to the space-time coding (STC) method (the number of space-time streams $N_{sts}$) used to transmit the data field 608. That is, the PPDU generator 210 generates an MF control PHY PPDU 600 having the legacy length field value $L_{LH}$ and the NG60 length field value $L_{NH}$ that satisfy expressions (7) and (8).

Note that in the case of the MF control PHY PPDU 600, unless the NG60 header 604 is properly decoded on the receiving side, the channel bandwidth information (CBW) cannot be detected and, therefore, it is difficult to decode the space-time stream. Thus, although the NG60 STF 606 to TRN-R/T subfield 610 can be transmitted using variable bandwidth, the legacy preamble 601 to the second padding field 605 need to be transmitted using the standard bandwidth.

Configuration of Transmission Processor

The transmission processor 300 illustrated in FIG. 5 performs predetermined transmission baseband processing on the MF control PHY PPDU 600 (refer to FIG. 6) output from the controller 200. Thereafter, the transmission processor 300 outputs the MF control PHY PPDU 600 to the antenna unit 400. The transmission processor 300 includes a transmission baseband processor 310 and a transmission RF front end 320.

The transmission baseband processor 310 performs transmission baseband processing, such as scrambling, LDPC coding, DBPSK modulation, spreading, and space-time coding, on the MF control PHY PPDU 600. Thereafter, the transmission baseband processor 310 outputs, to the transmission RF front end 320, the MF control PHY PPDU 600 subjected to the transmission baseband processing.

Note that the transmission baseband processor 310 performs DBPSK modulation on the LDPC codeword of the NG60 header 604 with 90-degree phase rotation, for example. That is, the transmission baseband processor 310 rotates the phase of the modulation signal of the portion of the NG60 header 604 by 90 degrees with respect to the phase of the modulation signal of the other portion. The amount of rotation of the phase is not limited to 90 degrees. For example, the amount of rotation may be −90 degrees. Any other amount of rotation may be employed if the receiving device can distinguish the constellation point of the modulation signal of the portion of the NG60 header 604 from the constellation point of the modulation signal of the other portion.

Configuration of Transmission Baseband Processor

Figure 8:
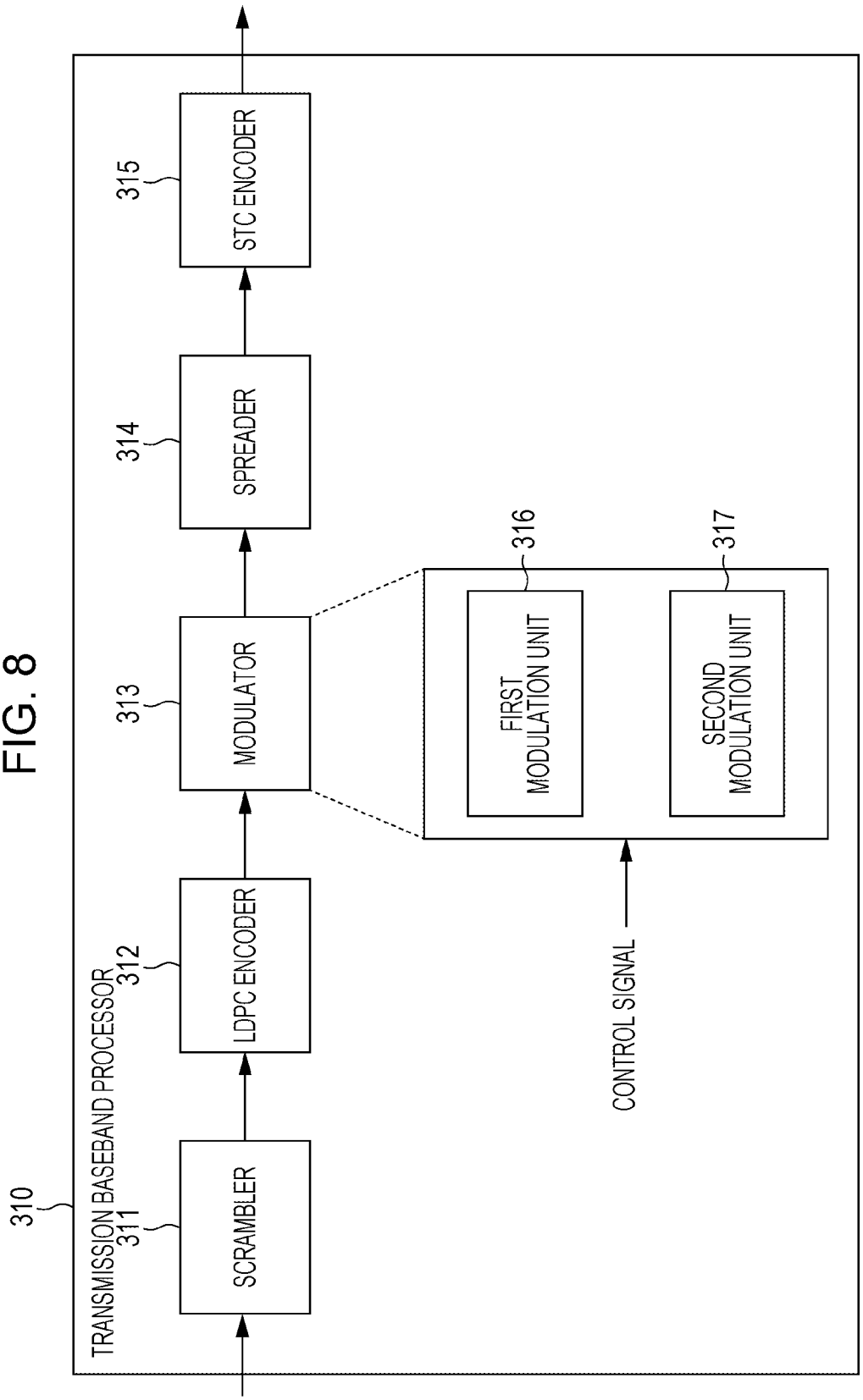
FIG. 8 is a block diagram illustrating an example of the configuration of a transmission baseband processor according to the first embodiment.

FIG. 8 is a block diagram illustrating an example of the configuration of the transmission baseband processor 310. FIG. 8 corresponds to FIG. 3.

As illustrated in FIG. 8, the transmission baseband processor 310 includes a scrambler 311, an LDPC encoder 312, a modulator 313, a spreader 314, and an STC encoder 315.

The scrambler 311 scrambles the bits of the legacy header 602, the first padding field 603, the NG60 header 604, the second padding field 605, and the data field 608 (refer to FIG. 6) of the MF control PHY PPDU 600 output from the controller 200 in accordance with the same scrambling rule as the legacy WiGig.

The shift register of the scrambler 311 is initialized in accordance with the scrambler initialization field (refer to FIG. 2) of the legacy header 602. As a result, the scrambler 311 continuously scrambles a portion after the length field of the legacy header 602 (immediately after the scrambler initialization field), a first padding field 603, an NG60 header 604, a second padding field 605, and a data field 608 without resetting the shift register.

Thereafter, the scrambler 311 outputs, to the LDPC encoder 312, the MF control PHY PPDU 600 having the portion of the legacy header 602 from the length field to the second padding field 605 and the portion of the data field 608 that are scrambled.

The LDPC encoder 312 performs LDPC coding on the MF control PHY PPDU 600 output from the scrambler 311 with an approximate code rate of ½ in accordance with the same encoding rule as for the legacy WiGig to generate a plurality of LDPC codewords. Thereafter, the LDPC encoder 312 outputs, to the modulator 313, the MF control PHY PPDU 600 having the portion from the legacy header 602 to the second padding field 605 and the portion of the data field 608 that are LDPC coded.

In the following description, the first LDPC codeword, that is, the LDPC codeword including the bits of the legacy header 602, is referred to as a "legacy header LDPC codeword". The second LDPC codeword, that is, the LDPC codeword including the bits of the NG60 header 604, is referred to as "NG60 header LDPC codeword". Each of the third LDPC codewords and the subsequent LDPC codewords, that is, an LDPC codeword that does not include the bits of the legacy header 602 and the bits of the NG60 header 604, is referred to as a "data LDPC codeword".

That is, the legacy header LDPC codeword and the NG60 header LDPC codeword are generated in the same manner as the header LDPC codeword of the legacy WiGig technology. In addition, the data LDPC codeword is generated in the same manner as the data LDPC codeword of the legacy WiGig technology.

Figure 9:
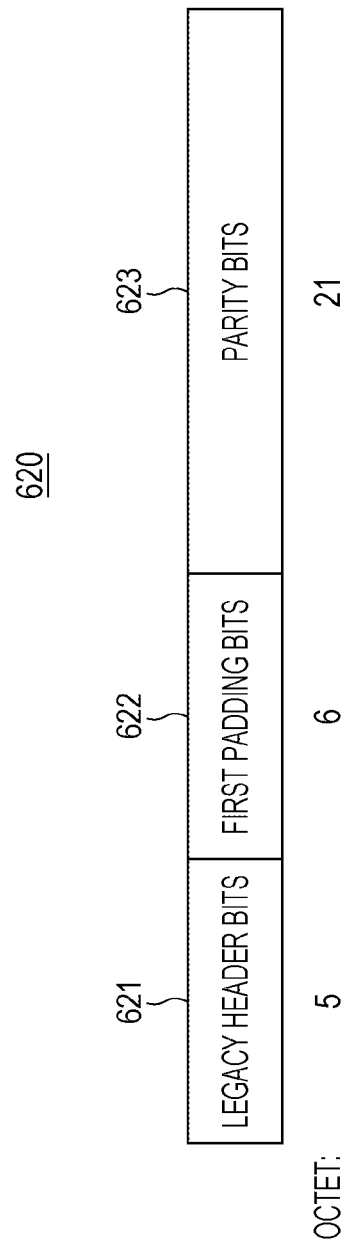
FIG. 9 illustrates an example of the structure of a legacy header LDPC codeword according to the first embodiment.
Figure 10:
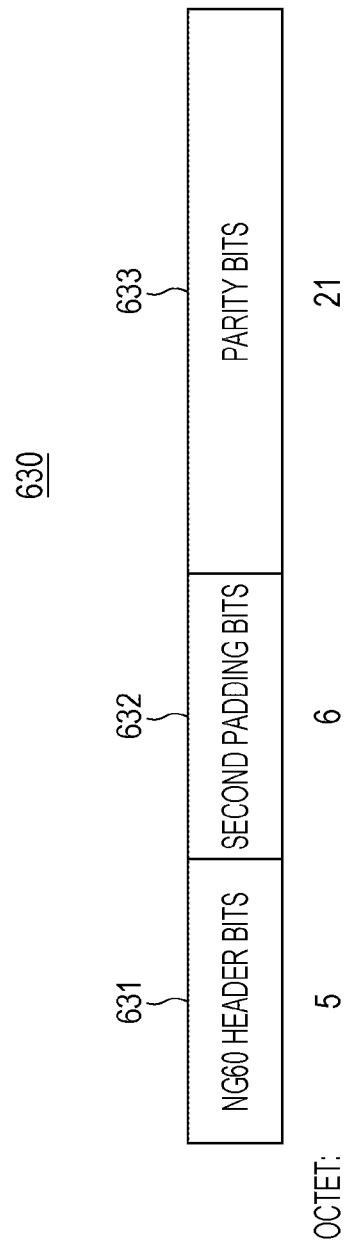
FIG. 10 illustrates an example of the structure of an NG60 header LDPC codeword according to the first embodiment.

FIG. 9 illustrates an example of the structure of the legacy header LDPC codeword. In addition, FIG. 10 illustrates an example of the structure of the NG60 header LDPC codeword. Each of FIGS. 9 and 10 corresponds to FIG. 4.

As illustrated in FIG. 9, the legacy header LDPC codeword 620 has legacy header bits 621, first padding bits 622, and parity bits 623 disposed in this order.

The legacy header bits 621 have a length of 5 octets and represent the LDPC codeword of the legacy header 602 illustrated in FIG. 6. The first padding bits 622 have a length of 6 octets and represent the LDPC codeword of the first padding field 603 illustrated in FIG. 6. The parity bits 623 have a length of 21 octets and represent parity bits used for error correction coding performed on the legacy header bits 621 and the first padding bits 622.

In addition, as illustrated in FIG. 10, the NG60 header LDPC codeword 630 includes NG60 header bits 631, second padding bits 632, and parity bits 633 in this order.

The NG60 header bits 631 have a length of 5 octets and represent the LDPC codeword of the NG60 header 604 illustrated in FIG. 6. The second padding bits 632 have a length of 6 octets and represent the LDPC codeword of the second padding field 605 illustrated in FIG. 6. The parity bits 633 have a length of 21 octets and represent parity bits used for error correction coding of the NG60 header bits 631 and the second padding bits 632.

The modulator 313 illustrated in FIG. 8 modulates the plurality of LDPC codewords (the legacy header LDPC codeword, the NG60 header LDPC codeword, the data LDPC codeword) included in the MF control PHY PPDU 600 output from the LDPC encoder 312 by using DBPSK and converts the plurality of LDPC codewords into a stream of complex constellation points.

Note that the modulator 313 performs DBPSK modulation on the NG60 header LDPC codeword with a phase rotation of, for example, 90 degrees. That is, the modulator 313 sets the phase of the modulation signal of the NG60 header LDPC codeword to a phase rotated by 90 degrees with respect to the phase of the modulation signal of the other portion. The amount of rotation of the phase is not limited to 90 degrees. For example, the amount of rotation may be −90 degrees. Any other amount of rotation may be employed if the receiving device can distinguish the constellation point of the modulation signal of the portion of the NG60 header 604 from the constellation point of the modulation signal of the other portion.

The modulator 313 includes a first modulation unit 316 and a second modulation unit 317.

The first modulation unit 316 performs DBPSK modulation similar to that of legacy WiGig on the plurality of LDPC codewords other than the NG60 header LDPC codeword, that is, the legacy header LDPC codeword and the data LDPC codeword.

The second modulation unit 317 performs DBPSK modulation on the NG60 header LDPC codeword by using a phase obtained by rotating the phase used in the DBPSK modulation of the first modulation unit 316 by, for example, 90 degrees. The amount of rotation of the phase is not limited to 90 degrees. For example, the amount of rotation may be −90 degrees. Any other amount of rotation may be employed if the receiving device can distinguish the constellation point of the modulation signal of the portion of the NG60 header 604 from the constellation point of the modulation signal of the other portion.

Note that the modulator 313 selectively uses the first modulation unit 316 and the second modulation unit 317 for each of the plurality of LDPC codewords on the basis of, for example, a control signal generated by the controller 200.

In this way, with the phase of the portion of the NG60 header 604 rotated, the modulator 313 outputs, to the spreader 314, the MF control PHY PPDU 600 having the modulated portion from the legacy header 602 to the second padding field 605 and the modulated portion of the data field 608. Note that in the MF control PHY PPDU 600, the phase of the portion of the NG60 header 604 is rotated.

The spreader 314 spreads the constellation points of the stream included in the MF control PHY PPDU 600 output from the modulator 313 by using the Golay sequence Ga32. Thereafter, the spreader 314 outputs, to the STC encoder 315, the MF control PHY PPDU 600 having the spread portion from the legacy header 602 to the second padding field 605 and the spread portion of the data field 608.

The STC encoder 315 performs a well-known space-time coding process using, for example, the Alamouti code on the spread constellation points corresponding to the data LDPC codeword to generate a plurality of space-time streams from the data field 608. Thereafter, the STC encoder 315 transmits, to the transmission RF front end 320, the MF control PHY PPDU 600 having the portion from the legacy header 602 to the second padding field 605 that is spread and the portion of the data field 608 that is spread and is subjected to a space-time streaming process.

The transmission RF front end 320 converts the MF control PHY PPDU 600 output from the transmission baseband processor 310 illustrated in FIG. 5 into a radio signal in the 60-GHz band by using a plurality of radio antennas provided in the antenna unit 400 and outputs the radio signal. At this time, the transmission RF front end 320 transmits the plurality of space-time streams generated from the data field 608 in parallel and separately. In addition, as described above, in the MF control PHY PPDU 600, the phase of the portion of the NG60 header 604 is rotated.

Note that when the legacy WiGig device receives such an MF control PHY PPDU 600, the portion from the first padding field 603 to the data field 608 (refer to FIG. 6) is processed as a portion of the data field 13 of the LF control PHY PPDU 10 (refer to FIG. 1).

Configuration of Reception Processor

The reception processor 500 performs predetermined reception baseband processing on the received signal output from the antenna unit 400 and outputs the signal to the controller 200. The reception processor 500 includes a reception RF front end 510 and a reception baseband processor 520.

The reception RF front end 510 receives a radio signal transmitted from another wireless communication device using a plurality of radio antennas provided in the antenna unit 400 and outputs the received signal to the reception baseband processor 520.

Note that the received signal may include the MF control PHY PPDU 600 transmitted from the NG60 WiGig device (a device having the same configuration as the wireless communication device 100). As described above, the MF control PHY PPDU 600 has the portion from the legacy header 602 to the second padding field 605 illustrated in FIG. 6 and the portion of the data field 608 that are modulated with the phase of the portion of the NG60 header 604 rotated.

If the received signal is an MF control PHY PPDU 600, the reception baseband processor 520 performs reception baseband processing, such as space-time decoding, despreading, DBPSK demodulation, LDPC decoding, and descrambling, on the received signal. Thereafter, the reception baseband processor 520 outputs, to the controller 200, the MF control PHY PPDU 600 subjected to the reception baseband processing.

Configuration of Reception Baseband Processor

Figure 11:
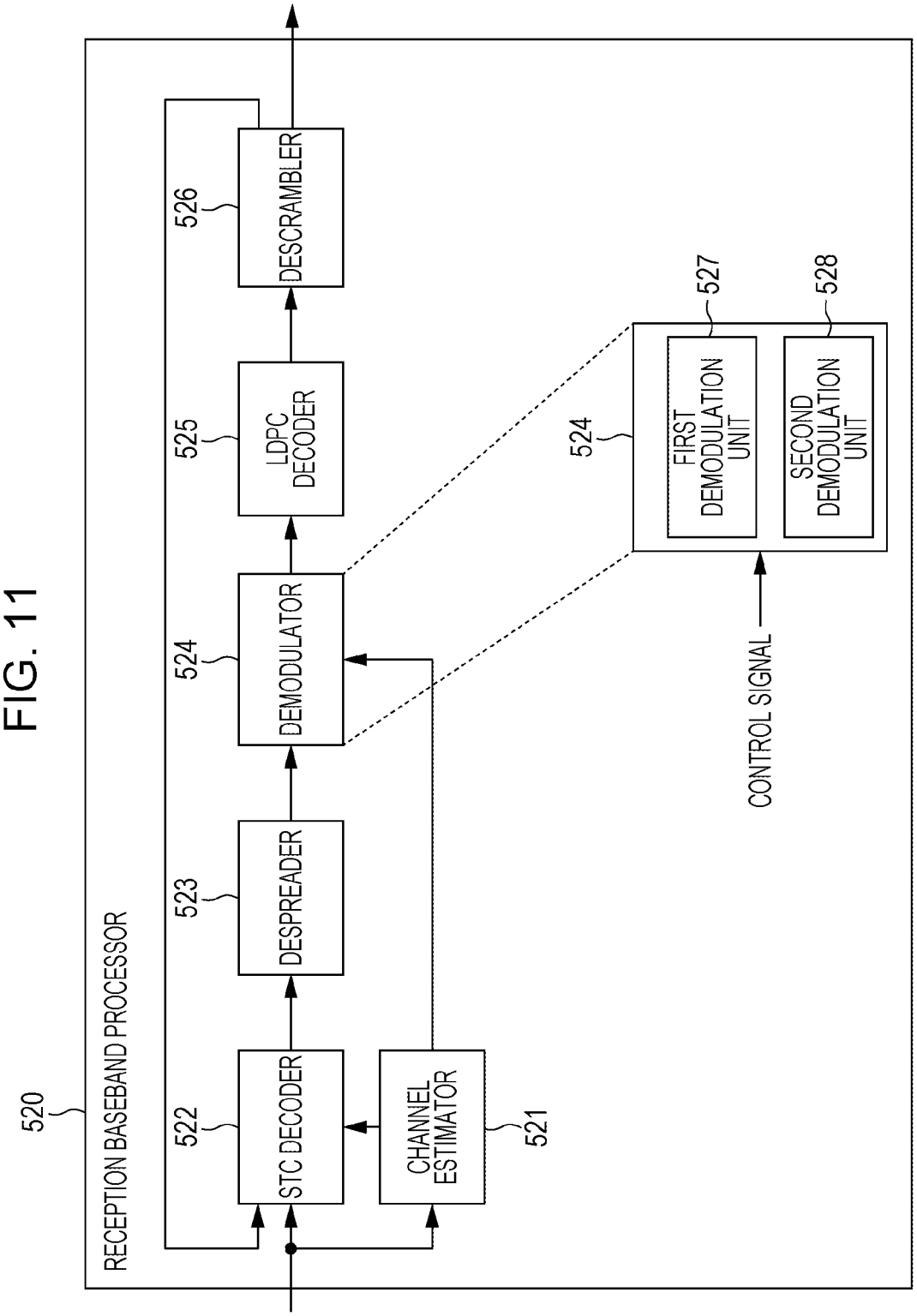
FIG. 11 is a block diagram illustrating an example of the configuration of a reception baseband processor according to the first embodiment.

FIG. 11 is a block diagram illustrating an example of the configuration of the reception baseband processor 520.

As illustrated in FIG. 11, the reception baseband processor 520 includes a channel estimator 521, an STC decoder 522, a despreader 523, a demodulator 524, an LDPC decoder 525, and a descrambler 526.

The reception baseband processor 520 first decodes the portions corresponding to the NG60 header 604 and the legacy header 602 of the received signal and acquires the original NG60 header 604 and the legacy header 602. Thereafter, the reception baseband processor 520 decodes the portion corresponding to the data field 608 of the received signal on the basis of information in the acquired NG60 header 604 and the legacy header 602.

Hereinafter, the stage of decoding the portions corresponding to the NG60 header 604 and the legacy header 602 is referred to as a "header decoding stage". In addition, the stage of decoding the portion corresponding to the data field 608 after the header decoding stage is referred to as a "data decoding stage".

The function of each of the units of the reception baseband processor 520 in the header decoding stage is described first.

If the received signal output from the reception RF front end 510 includes the MF control PHY PPDU 600, the channel estimator 521 performs channel estimation on the basis of the information in the NG60 CEFs 607 (refer to FIG. 6) of the received signal. Thereafter, the channel estimator 521 outputs the result of channel estimation to the STC decoder 522 and the demodulator 524.

The STC decoder 522 outputs, to the despreader 523, the received signal output from the reception RF front end 510 and holds the same signal for processing to be performed in the data decoding stage.

The despreader 523 performs despreading on the portion corresponding to the legacy header 602 to the second padding field 605 in the received signal output from the STC decoder 522. Note that such despreading is an arithmetic process that is the reverse of the spreading performed by the spreader 314 of the transmission baseband processor 310. Thereafter, the despreader 523 outputs, to the demodulator 524, the received signal having the despread portion corresponding to the legacy header 602 to the second padding field 605.

The demodulator 524 demodulates the despread portion of the received signal output from the despreader 523 on the basis of the result of channel estimation performed by the channel estimator 521 (the result of estimation using CEF 17 (refer to FIG. 1)). Note that such demodulation is an arithmetic operation that is the reverse of the modulation performed by the modulator 313 of the transmission baseband processor 310. That is, the demodulator 524 performs DBPSK demodulation on the portion corresponding to the NG60 header LDPC codeword by using a phase obtained by rotating the phase used for DBPSK demodulation performed on the other portion by, for example, 90 degrees.

The demodulator 524 includes a first demodulation unit 527 and a second demodulation unit 528.

The first demodulation unit 527 performs an arithmetic operation that is the reverse of the DBPSK modulation performed by the first modulation unit 316 on the portion corresponding to the legacy header 602 and the first padding field 603 in the received signal output from the despreader 523. In this manner, the first demodulation unit 527 demodulates the portion of the received signal.

The second demodulation unit 528 performs an arithmetic operation that is the reverse of the DBPSK modulation performed by the second modulation unit 317 on the portions of the received signal output from the despreader 523 which correspond to the NG60 header 604 and the second padding field 605. In this manner, the second demodulation unit 528 demodulates the portions.

Note that the demodulator 524 selectively uses the first demodulation unit 527 and the second demodulation unit 528 for the received signal output from the despreader 523 on the basis of, for example, a control signal generated by the controller 200.

The signal output from the first demodulation unit 527 corresponds to the legacy header 602, the first padding field 603, and the second padding field 605. In addition, the signal output from the second demodulation unit 528 corresponds to the NG60 header 604. Accordingly, the demodulator 524 can identify the portion corresponding to the NG60 header 604 in the received signal and extract the portion. The demodulator 524 outputs, to the LDPC decoder 525, the reception signal having the demodulated portion from the legacy header 602 to the second padding field 605 with the portion corresponding to the NG60 header 604 being indicated.

The LDPC decoder 525 performs LDPC decoding on the demodulated portion of the received signal output from the demodulator 524. Note that such decoding is the reverse of the LDPC coding performed by the LDPC encoder 312 of the transmission baseband processor 310 illustrated in FIG. 8. Thereafter, the LDPC decoder 525 outputs, to the descrambler 526, the received signal having LDPC-decoded portion corresponding to the legacy header 602 to the second padding field 605.

The descrambler 526 descrambles the LDPC-decoded portion of the received signal output from the LDPC decoder 525. Noted that such descrambling is an arithmetic operation that is the reverse of the scrambling performed by the scrambler 311 of the transmission baseband processor 310 illustrated in FIG. 8. Thereafter, the descrambler 526 outputs, to the STC decoder 522, the bits of the original NG60 header 604 obtained through the descrambling. In this manner, the header decoding stage is completed.

Note that as described above, the details of the MF control PHY PPDU 600 can be acquired from the legacy header 602 and the NG60 header 604.

The function of each of the units of the reception baseband processor 520 in the data decoding stage is described below.

The STC decoder 522 performs space-time decoding on a portion of the received signal corresponding to the data field 608 on the basis of the bits of the NG60 header 604 output from the descrambler 526 and the result of channel estimation performed by the channel estimator 521 (the result of estimation using the NG60 CEFs 607 (refer to FIG. 6)). Note that such space-time decoding is an arithmetic operation that is the reverse of the space-time coding performed by the STC encoder 315 of the transmission baseband processor 310 illustrated in FIG. 8. Thereafter, the STC decoder 522 outputs the result of the space-time decoding to the despreader 523.

The despreader 523, the first demodulation unit 527 of the demodulator 524, the LDPC decoder 525, and the descrambler 526 perform processing that is the same as the processing performed on the legacy header 602 and the like in the header decoding stage.

In this manner, the descrambler 526 acquires the bits of the original data field 608 and outputs the acquired bits of the data field 608 to the controller 200 together with the information about the legacy header 602 and the NG60 header 604. Such bits of the data field 608 are analyzed and processed by the controller 200 illustrated in FIG. 5.

Effect of Present Embodiment

As described above, the wireless communication device 100 according to the present embodiment can generate and transmit an MF control PHY PPDU 600. The MF control PHY PPDU 600 is a control PHY PPDU having a portion corresponding to the data field of a control PHY PPDU of the legacy WiGig, where the portion has data to be transmitted by using a variable bandwidth and the NG60 header 604 having information about transmission by using the variable bandwidth set forth therein. In addition, the MF control PHY PPDU 600 is a control PHY PPDU modulated by rotating the phase of a portion corresponding to the NG60 header 604 by, for example, 90 degrees with respect to the phase of the other portion.

In addition, upon receiving the MF control PHY PPDU 600, the wireless communication device 100 according to the present embodiment can identify the NG60 header 604 on the basis of the above-described rotation of the phase and decode the data transmitted using the variable bandwidth. That is, the wireless communication device 100 can determine whether the received signal is an LF control PHY PPDU 10 or an MF control PHY PPDU 600 on the basis of the identification information given to the NG60 header 604.

Accordingly, the wireless communication device 100 according to the present embodiment can support transmission that makes use of variable bandwidth while maintaining backward compatibility with legacy WiGig. That is, the NG60 WiGig technology can increase the robustness of data transmission and increase the data transmission rate. In addition, the wireless communication device 100 according to the present embodiment can transmit and receive the MF control PHY PPDU 700 distinctively from the LF control PHY PPDU 10.

Note that upon receiving the LF control PHY PPDU 10, the wireless communication device 100 directly outputs the portion of the data field 13 (FIG. 1) of the LF control PHY PPDU 10 to the controller 200. That is, in the header decoding stage, the wireless communication device 100 demodulates the legacy header 602. In addition, in the data decoding stage, the wireless communication device 100 performs despreading, DBPSK demodulation, LDPC decoding, and descrambling on the portion corresponding to the data field 13 without performing space-time decoding.

Alternatively, the wireless communication device 100 may include both a reception processor for performing processing based on the LF control PHY PPDU and a reception processor for performing processing based on the MF control PHY PPDU. Thereafter, if a control PHY PPDU is included in the received signal, the wireless communication device 100 may process the received signal by using both the reception processors in parallel until the format is identified.

Another Example of Transmission Method

Note that when a channel having a channel bandwidth larger than the standard bandwidth is available, the wireless communication device 100 may transmit the MF control PHY PPDU 600 by using such a channel.

For example, the transmission baseband processor 310 makes (M−1) copies (M is a natural number greater than 1) of the portion from the legacy preamble 601 to the second padding field 605 in a channel having a channel bandwidth that is M times the standard bandwidth. Thereafter, the transmission baseband processor 310 applies an appropriate frequency offset to each of the copies, multiplexes the original data and the (M−1) copies in the frequency direction on the above-mentioned channel, and transmits the original data and the (M−1) copies at the same time.

Figure 12:
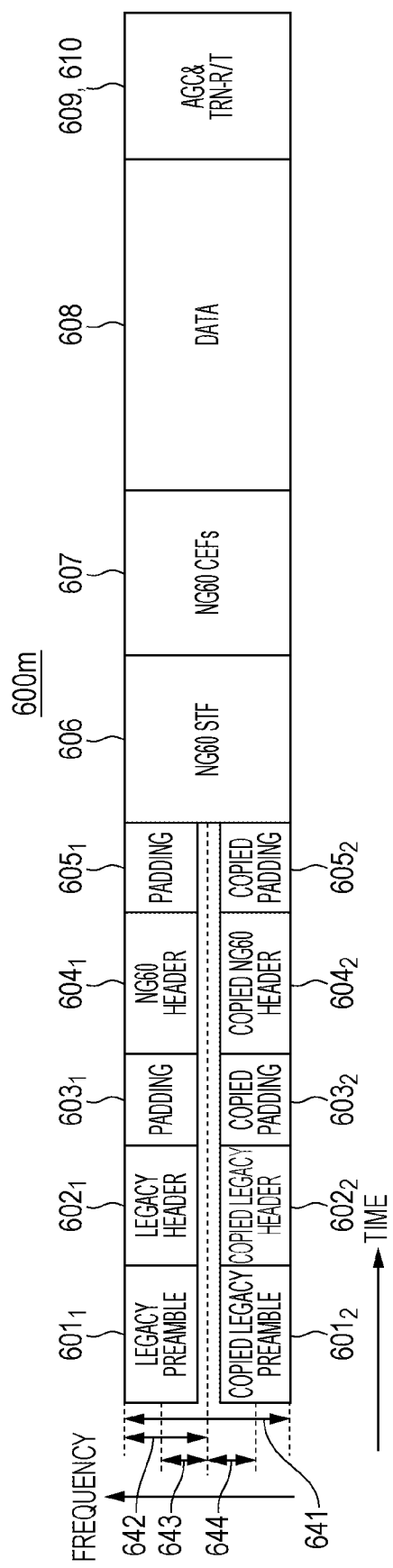
FIG. 12 illustrates another example of a method for transmitting an MF control PHY PPDU according to the first embodiment.

FIG. 12 is a diagram illustrating an example of transmission of the MF control PHY PPDU 600 (refer to FIG. 6) on a channel having a channel bandwidth that is twice the standard bandwidth. FIG. 12 corresponds to FIG. 6.

As illustrated in FIG. 12, it is assumed that a channel bandwidth 641 is twice a standard bandwidth 642. In this case, the transmission baseband processor 310 sets the frequency offset of the portion from a legacy preamble $601_1$ to a second padding field $605_1$ (the original data) to, for example, 50% of the standard bandwidth. In addition, the transmission baseband processor 310 sets the frequency offset of the portion from a legacy preamble $601_2$ to a second padding field $605_2$ (copied data) to −50% of the standard bandwidth.

In this manner, by effectively using the channel bandwidth, the NG60 WiGig technology can further enhance the robustness of data transmission. Note that upon receiving a plurality of sets of portions from the legacy preamble 601 to the second padding field 605, the reception baseband processor 520 of the wireless communication device 100 on the receiving side may integrate these sets of data.

Second Embodiment

The NG60 WiGig device used when identification information is provided in the NG60 header by setting the format identification information in the control PHY PPDU is described below as the second embodiment of the present disclosure.

Configuration of Device

Figure 13:
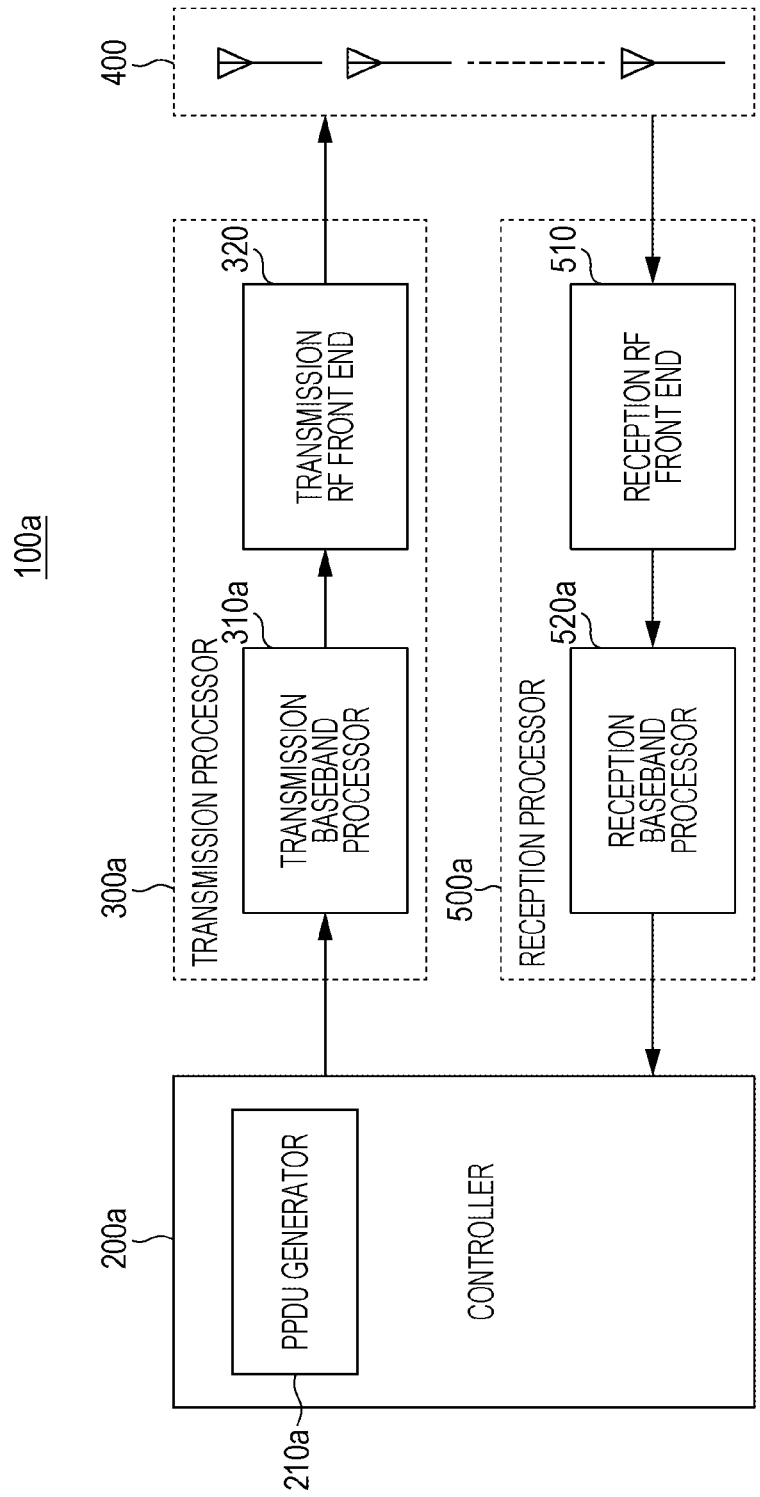
FIG. 13 is a block diagram illustrating an example of the configuration of an NG60 WiGig device according to a second embodiment.

FIG. 13 is a block diagram illustrating an example of the configuration of a wireless communication device (an NG60 WiGig device) according to the present embodiment. FIG. 13 corresponds to FIG. 5 according to the first embodiment. The same elements as those in FIG. 5 are designated by the same reference numerals, and descriptions of the elements are not repeated.

Although not illustrated, the wireless communication device according to the present embodiment includes, for example, a CPU, a storage medium, such as a ROM, storing a control program, a work memory, such as a RAM, and a communication circuit. In this case, the function of each of the elements of the wireless communication device is provided by, for example, the CPU executing the control program.

As illustrated in FIG. 13, a wireless communication device 100a has a controller 200a, a transmission processor 300a, an antenna unit 400, and a reception processor 500a.

The controller 200a includes a PPDU generator 210a instead of the PPDU generator 210 according to the first embodiment. The transmission processor 300a includes a transmission baseband processor 310a instead of the transmission baseband processor 310 according to the first embodiment. The reception processor 500a has a reception baseband processor 520a instead of the reception baseband processor 520 according to the first embodiment.

The PPDU generator 210a generates an MF control PHY PPDU from the payload data of the PSDU and transmits the generated MF control PHY PPDU by using the transmission processor 300 and the antenna unit 400. Note that the PPDU generator 210a generates an MF control PHY PPDU having a format that differs from that of the first embodiment.

Control PHY PPDU Format

FIG. 14 is a diagram illustrating an example of the format of the MF control PHY PPDU according to the present embodiment. FIG. 14 corresponds to FIG. 1 and FIG. 6 of the first embodiment.

As illustrated in FIG. 14, the MF control PHY PPDU 700 of the present embodiment includes a legacy preamble 701, a legacy header 702, an NG60 header 703, an NG60 STF 704, a plurality of NG60 CEFs 705, and a data field 706 in this order.

Note that when used for beam refinement, the MF control PHY PPDU 700 may further include an AGC subfield 707 and a TRN-R/T subfield 708 after the data field 706. That is, the AGC subfield 707 and the TRN-R/T subfield 708 are optional.

The MF control PHY PPDU 700 according to the present embodiment does not include the first padding field 603 and the second padding field 605 (refer to FIG. 6) that are provided in the MF control PHY PPDU 600 according to the first embodiment.

The legacy preamble 701 has the same waveform as the legacy preamble 11 in the LF control PHY PPDU 10.

The legacy header 702 has the same configuration as the legacy header 12 of the LF control PHY PPDU 10 (refer to FIG. 2).

The NG60 header 703 provides information about the details of the MF control PHY PPDU 700 by itself or together with the legacy header 702. The details of the structure of the NG60 header 703 are described below.

The NG60 STF 704 is an area used for retraining of automatic gain control (AGC). That is, the NG60 STF 704 has the same waveform as the NG60 STF 606 (refer to FIG. 6) in the MF control PHY PPDU 600 according to the first embodiment.

The plurality of NG60 CEFs 705 are an area used for channel estimation of a plurality of space-time streams generated from the data field 706. That is, the plurality of NG60 CEFs 705 have the same waveform as the plurality of NG60 CEFs 607 (refer to FIG. 6) in the MF control PHY PPDU 600 according to the first embodiment.

The data field 706 stores the payload data of the PSDU. That is, the data field 706 corresponds to the data field 608 (refer to FIG. 6) in the MF control PHY PPDU 600 according to the first embodiment.

The AGC subfield 707 and the TRN-R/T subfield 708 has information about beam refinement set forth therein. That is, the AGC subfield 707 and the TRN-R/T subfield 708 have waveforms similar to those of the AGC subfield 609 and the TRN-R/T subfield 610 (refer to FIG. 6) in the MF control PHY PPDU 600 according to the first embodiment, respectively.

That is, the PPDU generator 210a generates the MF control PHY PPDU 700 having a structure generated by removing the first padding field 603 and the second padding field 605 from the MF control PHY PPDU 600 according to the first embodiment.

Note that unlike the NG60 header 604 according to the first embodiment, the NG60 header 703 of the MF control PHY PPDU 700 has format identification information indicating that it is a portion of the NG60 header 703 set forth therein. The format identification information is a predetermined sequence.

FIG. 15 is a diagram illustrating an example of the structure of the NG60 header 703. FIG. 15 corresponds to FIG. 7 according to the first embodiment. FIG. 16 is a diagram illustrating another example of the structure of the NG60 header 703. For the NG60 header 703, either one of the structure illustrated in FIG. 15 and the configuration illustrated in FIG. 16 can be adopted.

As illustrated in FIG. 15, the NG60 header 703 has a structure similar to that of the NG60 header 604 (refer to FIG. 7) according to the first embodiment, except that a format identification field is provided prior to a CBW field. In addition, as illustrated in FIG. 16, the NG60 header 703 has a structure similar to that of the NG60 header 604 according to the first embodiment, except that the NG60 header 703 includes a format identification/CBW field instead of the CBW field. Descriptions of the same fields are not repeated.

The format identification field illustrated in FIG. 15 has 8-bit information predetermined set forth therein as identification information indicating the start position of the NG60 header 703. That is, in the case of the structure illustrated in FIG. 15, format identification information and channel bandwidth information are separately signaled.

The format identification/CBW field illustrated in FIG. 16 has 8-bit information set forth therein which serves as identification information indicating the start position of the NG60 header 703 and information specifying the channel bandwidth (CBW) at the same time. That is, in the case of the structure illustrated in FIG. 16, the format identification information and the channel bandwidth information are signaled together.

The information set forth in the CBW field or the format identification/CBW field can be one of a plurality of predefined sequences, such as Golay sequences Ga8 each having a length of 8.

By using such a structure, the NG60 header 703 of the MF control PHY PPDU 700 can be identified on the receiving side by detecting the identification information. Thus, the need for the phase rotation at the time of modulation as in the first embodiment is eliminated.

Note that the PPDU generator 210a sets the value of the length field of the legacy header 602 while taking into account the entire portion from the NG60 header 703 to the data field 706. As a result, upon receiving the MF control PHY PPDU 700, the legacy WiGig device can correctly determine the number of data octets of the PSDU.

As used herein, as described in the first embodiment, the value of the length field of the legacy header 702 is referred to as a legacy length field value $L_{LH}$, and the value of the length field of the NG60 header 703 is referred to as a NG60 length field value $L_{NH}$.

According to the calculation method described in the first embodiment, the equivalent length of the NG60 STF 704 and NG60 CEFs 705 is $6.25+N_{sts}\times2.25$ octets. Therefore, the legacy length field value $L_{LH}$ is the sum of the NG60 length field value $L_{NH}$, the length of the NG60 header 703 (i.e., 6 octets), and the equivalent length of the NG60 STF 704 and NG60 CEFs 705. That is, the legacy length field value $L_{LH}$ is given by, for example, the following expression (9):

$$L_{LH}=L_{NH}+12.25+N_{sts}\times2.25 \quad (9)$$

Therefore, according to the logic described in the first embodiment, the following expression (10) is derived:

$$N_{sts}\times72 \leq 1010.75-L_{NH} \quad (10)$$

The PPDU generator 210a generates an MF control PHY PPDU 600 such that the legacy length field value $L_{LH}$ and the NG60 length field value $L_{NH}$ satisfy expressions (9) and (10).

Note that like the MF control PHY PPDU 600 of the first embodiment, in the case of the MF control PHY PPDU 700, the portion from the legacy preamble 701 to the NG60 header 703 needs to be transmitted using a standard bandwidth.

Configuration of Transmission Baseband Processor

The transmission baseband processor 310a has the same configuration as the transmission baseband processor 310 (refer to FIG. 8) according to the first embodiment except for the portion of the modulator 313.

Note that the above-described scrambling process performed by the transmission baseband processor 310a is applied to the portion of the length field of the legacy header 702 in the MF control PHY PPDU 700 and the subsequent portion and the portion from the length field of the NG60 header 703 to the data field 706. In addition, the above-described processes such as encoding, modulation, and spreading performed by the transmission baseband processor 310a is applied to the portions of the legacy header 702, the NG60 header 703, and the data field 706 in the MF control PHY PPDU 700.

Therefore, for example, the LDPC encoder 312 outputs an LDPC codeword including the bits of the legacy header 702 and the NG60 header 703 (hereinafter referred to as a "header LDPC codeword") and a data LDPC codeword not including the bits of the legacy header 702 and the NG60 header 703.

Note that as described above, the transmission baseband processor 310a does not perform a scrambling process on the area of the format identification field or the format identification/CBW field of the NG60 header 703, which has the identification information of the NG60 header 703 (hereinafter referred to as "identification information description area") set forth therein. The transmission baseband processor 310a stops performing a scrambling process on the above-described area on the basis of, for example, a control signal that is generated by the controller 200a and that indicates the position of the identification information description area.

Figure 17:
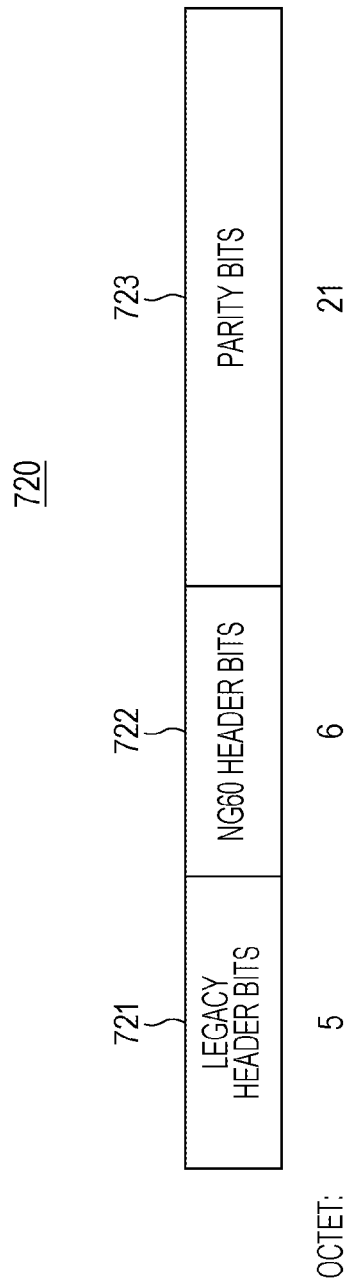
FIG. 17 illustrates an example of the structure of a header LDPC codeword according to the second embodiment.

FIG. 17 is a diagram illustrating an example of the structure of the header LDPC codeword. FIG. 17 corresponds to FIG. 4 and FIG. 9 of the first embodiment.

As illustrated in FIG. 17, the header LDPC codeword 720 has a legacy header bits 721, NG60 header bits 722, and parity bits 723 disposed in this order.

The legacy header bits 721 have a length of 5 octets and represent the LDPC codeword of the legacy header 702. The NG60 header bits 722 have a length of 6 octets and represent the LDPC codeword of the NG60 header 703. The parity bits 723 have a length of 21 octets and represent parity bits used for error correction coding of the legacy header bits 721 and the NG60 header bits 722.

The modulator according to the present embodiment (not illustrated) has the same configuration as the modulator 313 according to the first embodiment, except that the modulator does not include the second modulation unit 317.

The NG60 header 703 can be identified by the presence of the identification information description area in the NG60 header 703. Therefore, unlike the first embodiment, the modulator according to the present embodiment does not apply phase rotation of DBPSK modulation to the portion of the NG60 header 703.

That is, the modulator according to the present embodiment modulates all of the header LDPC codeword 720 (refer to FIG. 17) and the data LDPC codeword output from the LDPC encoder 312 by using the same DBPSK and converts the codewords into a stream of complex constellation points. In other words, the modulator according to the present embodiment performs the same DBPSK modulation on the portion of the NG60 header 703 and the portion other than the NG60 header 703 which includes the legacy header 702.

Configuration of Reception Baseband Processor

The reception baseband processor 520a illustrated in FIG. 13 has the same configuration as the reception baseband processor 520 (refer to FIG. 11) according to the first embodiment except for the portion of the demodulator 524.

Note that the above-described descrambling process performed by the reception baseband processor 520a is applied to a portion of the MF control PHY PPDU 700 after the length field of the legacy header 702 and a portion from the length of the NG60 header 703 Field to the data field 706. In addition, the above-described processing such as decoding, demodulation, and despreading performed by the reception baseband processor 520a is applied to the portions of the legacy header 702, the NG60 header 703, and the data field 706 of the MF control PHY PPDU 700.

The demodulator according to the present embodiment (not illustrated) has the same configuration as the demodulator 524 of the first embodiment except that the demodulator does not include the second demodulation unit 528.

The NG60 header 703 can be identified on the receiving side on the basis of the presence of the identification information description area of the NG60 header 703 instead of the phase rotation at the time of modulation of the NG60 header 703. Therefore, unlike the first embodiment, the demodulator according to the present embodiment does not perform phase rotation of the DBPSK demodulation for the NG60 header 703 in the header decoding stage.

Subsequently, in the header decoding stage, the descrambler 526 detects the identification information set forth in the identification information description area and outputs the bits of the NG60 header 703 to the STC decoder 522 on the basis of the detected identification information. The descrambler 526 detects the identification information description area on the basis of, for example, a control signal that is generated by the controller 200a and that indicates the position of the identification information description area. Alternatively, the descrambler 526 may detect the identification information description area on the basis of the position of the STF 16 (refer to FIG. 1).

Subsequently, like the first embodiment, the reception processor 500a performs the processing of the data decoding stage.

Effect of Present Embodiment

As described above, the wireless communication device 100a according to the present embodiment is capable of generating the MF control PHY PPDU 700 having the identification information for identifying the NG60 header 703 in the data field of the control PHY PPDU of the legacy WiGig and transmitting the generated MF control PHY PPDU 700.

In addition, upon receiving the MF control PHY PPDU 700, the wireless communication device 100a according to the present embodiment is capable of identifying the NG60 header 703 on the basis of the description of the identification information and decoding the data that is a target of transmission that makes use of variable bandwidth.

Accordingly, by adopting the wireless communication device 100a according to the present embodiment can support transmission using variable bandwidth without performing phase rotation in modulation and demodulation, while maintaining backward compatibility with legacy WiGig.

In addition, the wireless communication device 100a according to the present embodiment is capable of detecting the NG60 header 703 when processing the first LDPC codeword (i.e., the header LDPC codeword 720), since the header LDPC codeword 720 includes the bits of the legacy header 702 and the NG60 header 703. In contrast, according to the first embodiment, it is difficult to detect the NG60 header 604 unless the second LDPC codeword (i.e., the NG60 header LDPC codeword 630) is processed.

Therefore, as compared with the first embodiment, the wireless communication device 100a according to the present embodiment is capable of identifying the MF control PHY PPDU earlier from the received signal. Thus, power consumption can be reduced.

In addition, the MF control PHY PPDU 700 of the wireless communication device 100a according to the present embodiment does not have the first padding field 603 and the second padding field 605 that are present in the MF control PHY PPDU 600 according to the first embodiment. Therefore, the wireless communication device 100a according to the present embodiment can remove the cause of excessive overhead and improve the data transmission efficiency, as compared with the first embodiment.

Note that upon receiving the LF control PHY PPDU 10, the wireless communication device 100a directly outputs the portion (FIG. 1) of the data field 13 of the LF control PHY PPDU 10 to the controller 200. Alternatively, as described in the first embodiment, the wireless communication device 100a may include both a reception processor for the LF control PHY PPDU and a reception processor for the MF control PHY PPDU and process the received signal by using both the reception processors in parallel until the format is identified.

Another Example of Transmission Method

In addition, according to the present embodiment, the MF control PHY PPDU 700 may be transmitted by using a channel having a channel bandwidth larger than the standard bandwidth.

Figure 18:
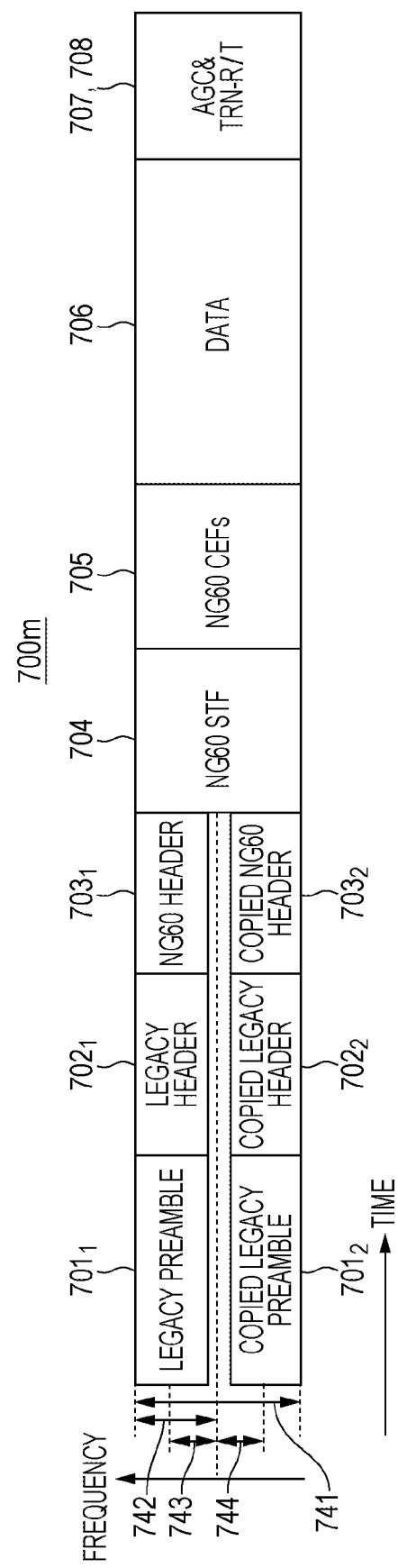
FIG. 18 illustrates another example of the method for transmitting an MF control PHY PPDU according to the second embodiment.

FIG. 18 illustrates an example of transmission of the MF control PHY PPDU 700 (refer to FIG. 14) through a channel having a channel bandwidth that is twice the standard bandwidth. FIG. 18 corresponds to FIG. 14 and FIG. 12 of the first embodiment.

As illustrated in FIG. 18, it is assumed that a channel bandwidth 741 is twice a standard bandwidth 742. In this case, for example, the transmission baseband processor 310a sets the frequency offset of the portion from a legacy preamble 7011 to an NG60 header 7031 (original data) to 50% of the standard bandwidth. Thereafter, the transmission baseband processor 310 sets the frequency offset of the portion from a legacy preamble 7012 to an NG60 header 7032 (copied data) to −50% of the standard bandwidth.

Another Example of Position of Identification Information

In addition, the position of the identification information description area and the description format of the identification information are not limited to the above-described examples. For example, the wireless communication device 100a on the transmitting side may describe the identification information using a header check sequence (HCS) checking. In this case, if the HCS checking of the NG60 header 703 is successful, the wireless communication device 100a on the receiving side determines that the MF control PHY PPDU has been received. However, if the HCS checking is not successful, the wireless communication device 100a on the receiving side determines that the LF control PHY PPDU has been received.

Modifications of Embodiments

While the above-described embodiments have been described with reference to the example in which the configuration of the transmission system corresponding to NG60 WiGig and the configuration of the reception system corresponding to NG60 WiGig are disposed in one device, the configuration is not limited thereto. That is, the configuration of the transmission system corresponding to the NG60 WiGig and the configuration of the reception system corresponding to the NG60 WiGig may be disposed in different wireless communication devices.

Overview of Present Disclosure

According to the present disclosure, a wireless communication device includes a physical layer protocol data unit (PPDU) generator that generates a PPDU including a legacy preamble, a legacy header, a non-legacy header, a data field, and identification information indicating that the non-legacy header is included in the PPDU and a transmission unit that transmits the PPDU.

Note that in the wireless communication device, the identification information may be format identification information included in a top portion of the non-legacy header.

In addition, in the wireless communication device, the non-legacy header may be disposed immediately after the legacy header in the physical layer protocol data unit.

In addition, in the wireless communication device, the non-legacy header may further include information regarding one or more channel bandwidths, and the format identification information and the information regarding the one or more channel bandwidths may be individually described in the non-legacy header.

In addition, in the wireless communication device, the non-legacy header may further include information regarding one or more channel bandwidths, and the format identification information and the information regarding the one or more channel bandwidth may be jointly described in a single field in the non-legacy header.

In addition, in the wireless communication device, each of the format identification information and the information regarding the one or more channel bandwidths may be described in the non-legacy header by using a sequence, and the sequence may be selected from among a plurality of sequences defined in accordance with the channel bandwidths.

In addition, in the wireless communication device, the transmitter may include an encoder that performs error correction coding on the PPDU by encoding the legacy header and the non-legacy header into a single codeword, and the modulator may map the encoded legacy header and the encoded non-legacy header to the same constellation.

In addition, in the wireless communication device, the transmitter may include a scrambler that performs scrambling on the PPDU and an encoder that performs error correction coding on the scrambled PPDU. The scrambling may not be performed on the identification information.

In addition, in the wireless communication device, the transmitter may include a modulator that modulates the PPDU, and the modulator may modulate the non-legacy header by using a first phase that differs from a second phase used to modulate one of the legacy preamble and the legacy header.

A wireless communication method according to the present disclosure includes generating a physical layer protocol data unit (PPDU) including a legacy preamble, a legacy header, a non-legacy header, a data field, and identification information indicating that the non-legacy header is included in the PPDU and transmitting the DU.

The present disclosure is useful as a wireless communication device and a wireless communication method capable of increasing the data transmission rate in WiGig technology.

What is claimed is:

1. A wireless communication device, comprising:
   reception circuitry, which in operation, receives, from a transmission apparatus, a physical layer protocol data unit (PPDU) including a legacy header, a non-legacy header and a data field, the non-legacy header including a bandwidth field indicating a channel bandwidth, wherein the legacy header and the non-legacy header are encoded by the transmission apparatus into a first codeword of the PPDU; and
   decode circuitry, which in operation, performs error correction decoding on the first codeword of the received PPDU to detect the legacy header and the non-legacy header.

2. The wireless communication device according to claim 1, wherein the non-legacy header includes an identification information field indicating that the non-legacy header is included in the PPDU, and the identification information field is a format identification information field included in a top portion of the non-legacy header.

3. The wireless communication device according to claim 1, wherein the non-legacy header is disposed immediately after the legacy header in the PPDU.

4. The wireless communication device according to claim 2, wherein the format identification information field and the bandwidth field are individually described in the non-legacy header.

5. The wireless communication device according to claim 2, wherein the format identification information field and the bandwidth field are jointly described in a single field in the non-legacy header.

6. The wireless communication device according to claim 5, wherein each of the format identification information filed and the bandwidth field are described in the non-legacy header by using a sequence, and the sequence is selected from among a plurality of sequences defined in accordance with the channel bandwidth.

7. The wireless communication device according to claim 1, comprising:
   demodulation circuitry, which in operation, demodulates the received PPDU, wherein the decoding circuitry performs the error correction decoding on the first codeword of the demodulated PPDU.

8. The wireless communication device according to claim 2, comprising:
   descramble circuitry, which, in operation, performs descrambling on the PPDU, after the error correction decoding is performed by the decode circuitry, wherein the descrambling is not performed on the identification information field.

9. The wireless communication device according to claim 1, comprising:
   demodulation circuitry, which, in operation, demodulates the received PPDU, wherein the demodulation circuitry demodulates the non-legacy header by using a first phase that differs from a second phase used to demodulate one of a legacy preamble or the legacy header.

10. A wireless communication method, comprising:
- receiving, from a transmission apparatus, a physical layer protocol data unit (PPDU) including a legacy header, a non-legacy header and a data field, the non-legacy header including a bandwidth field indicating a channel bandwidth, wherein the legacy header and the non-legacy header are encoded by the transmission apparatus into a first codeword of the PPDU; and
- performing error correction decoding on the first codeword of the received PPDU to detect the legacy header and the non-legacy header.

11. The wireless communication method according to claim 10, wherein the non-legacy header includes an identification information field indicating that the non-legacy header is included in the PPDU, and the identification information field is a format identification information field included in a top portion of the non-legacy header.

12. The wireless communication method according to claim 10, wherein the non-legacy header is disposed immediately after the legacy header in the PPDU.

13. The wireless communication method according to claim 11, wherein the format identification information field and the bandwidth field are individually described in the non-legacy header.

14. The wireless communication method according to claim 11, wherein the format identification information field and the bandwidth field are jointly described in a single field in the non-legacy header.

15. The wireless communication method according to claim 14, wherein each of the format identification information filed and the bandwidth field are described in the non-legacy header by using a sequence, and the sequence is selected from among a plurality of sequences defined in accordance with the channel bandwidth.

16. The wireless communication method according to claim 10, comprising:
- demodulating the received PPDU, wherein the decoding includes performing the error correction decoding on the first codeword of the demodulated PPDU.

17. The wireless communication method according to claim 11, comprising:
- performing descrambling on the PPDU, after the error correction decoding is performed, wherein the descrambling is not performed on the identification information field.

18. The wireless communication method according to claim 11, comprising:
- demodulating the received PPDU, wherein the demodulating includes demodulating the non-legacy header by using a first phase that differs from a second phase used to demodulate one of a legacy preamble or the legacy header.

* * * * *